United States Patent
Chen

(10) Patent No.: US 12,021,033 B2
(45) Date of Patent: Jun. 25, 2024

(54) INTEGRATED CIRCUIT DEVICE HAVING ACTIVE REGION COUPLED TO METAL LAYERS ON OPPOSITE SIDES OF SUBSTRATE, AND METHOD

(71) Applicant: TAIWAN SEMICONDUCTOR MANUFACTURING COMPANY, LTD., Hsinchu (TW)

(72) Inventor: Chung-Hui Chen, Hsinchu (TW)

(73) Assignee: TAIWAN SEMICONDUCTOR MANUFACTURING LTD., Hsinchu (TW)

( * ) Notice: Subject to any disclaimer, the term of this patent is extended or adjusted under 35 U.S.C. 154(b) by 517 days.

(21) Appl. No.: 17/143,354

(22) Filed: Jan. 7, 2021

(65) Prior Publication Data

US 2021/0358850 A1 Nov. 18, 2021

Related U.S. Application Data

(60) Provisional application No. 63/025,519, filed on May 15, 2020.

(51) Int. Cl.
*H01L 23/538* (2006.01)
*H01L 23/50* (2006.01)

(52) U.S. Cl.
CPC .......... *H01L 23/5384* (2013.01); *H01L 23/50* (2013.01); *H01L 23/5385* (2013.01); *H01L 23/5386* (2013.01)

(58) Field of Classification Search
CPC ... H01L 23/481; H01L 23/50; H01L 23/5386; H01L 23/5384; H01L 27/0629
(Continued)

(56) References Cited

U.S. PATENT DOCUMENTS 5,614,442 A * 3/1997 Tserng ............... H01L 25/0657
                                              438/619
6,448,168 B1 * 9/2002 Rao ..................... H01L 23/522
                                              438/668
(Continued)

FOREIGN PATENT DOCUMENTS

KR  20110004280        1/2011
KR  20110004280   *    1/2013  ........... H01L 23/481
(Continued)

OTHER PUBLICATIONS

Office Action dated Jan. 27, 2022 for corresponding case No. KR 10-2021-0029402. (pp. 1-4).
(Continued)

*Primary Examiner* — Didarul A Mazumder
*Assistant Examiner* — Gustavo G Ramallo
(74) *Attorney, Agent, or Firm* — Hauptman Ham, LLP

(57) ABSTRACT

An integrated circuit (IC) device includes a substrate, a first active region, first and second conductive patterns, and a first through via structure. The substrate has opposite first and second sides. The first active region is over the first side of the substrate. The first conductive pattern is over and electrically coupled to the first active region. The first through via structure extends from the second side, through the substrate, to the first side in electrical contact with the first active region. The second conductive pattern is under the second side of the substrate and electrically coupled to the first through via structure.

20 Claims, 21 Drawing Sheets

(58) Field of Classification Search
CPC .......... H01L 23/5385; H01L 23/5228; H01L 23/5286; H01L 21/823475; H01L 23/485; H01L 27/088; H01L 23/538; H01L 23/48–482; H01L 23/488–49534
USPC ........................................................ 257/774
See application file for complete search history.

(56) References Cited

U.S. PATENT DOCUMENTS

| | | | |
|---|---|---|---|
| 7,260,442 | B2 | 8/2007 | Hwang et al. |
| 7,335,972 | B2 * | 2/2008 | Chanchani ............. H01L 25/50 257/E21.705 |
| 8,174,124 | B2 * | 5/2012 | Chiu .................. H01L 21/6835 257/E23.101 |
| 9,256,709 | B2 | 2/2016 | Yu et al. |
| 10,164,002 | B2 | 12/2018 | Chen et al. |
| 2011/0001249 | A1 * | 1/2011 | Law ................... H01L 23/5286 257/776 |
| 2012/0273878 | A1 | 11/2012 | Mallikarjunaswamy |
| 2012/0290996 | A1 | 11/2012 | Law et al. |
| 2012/0329219 | A1 | 12/2012 | Ding et al. |
| 2014/0040838 | A1 | 2/2014 | Liu et al. |
| 2015/0278429 | A1 | 10/2015 | Chang |
| 2018/0175034 | A1 | 6/2018 | Goktepeli et al. |
| 2019/0378790 | A1 | 12/2019 | Bohr et al. |
| 2020/0035560 | A1 | 1/2020 | Block et al. |
| 2020/0135646 | A1 | 4/2020 | Rubin et al. |

FOREIGN PATENT DOCUMENTS

| | | |
|---|---|---|
| KR | 20190072674 | 6/2019 |
| TW | 201601317 | 1/2016 |
| TW | 202017105 | 5/2020 |

OTHER PUBLICATIONS

Office Action dated Mar. 16, 2022 for corresponding case No. DE 10 2021 100 627.9. (pp. 1-10).
Office Action dated Jul. 28, 2022 for corresponding case No. KR 10-2021-0029402. (pp. 1-6) English abstract attached on p. 1.
Office Action dated Mar. 21, 2022 for corresponding case No. TW 11120276440. (pp. 1-6).

* cited by examiner

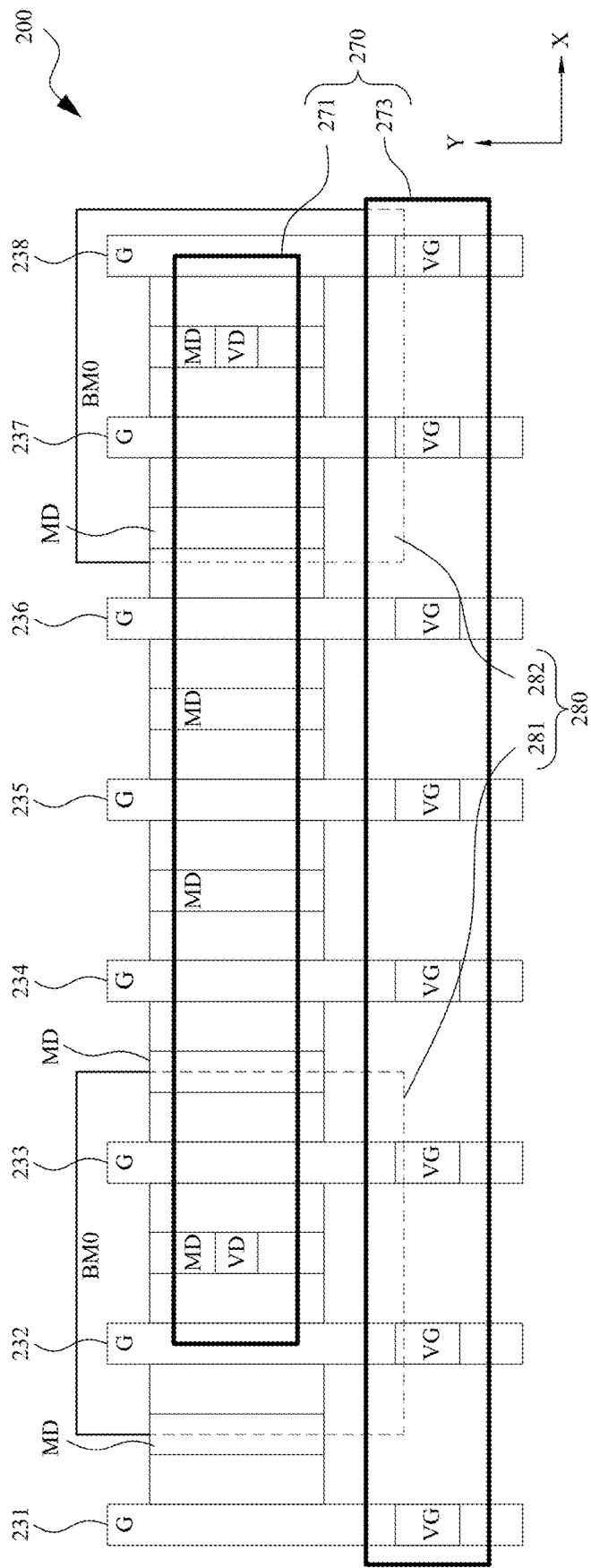
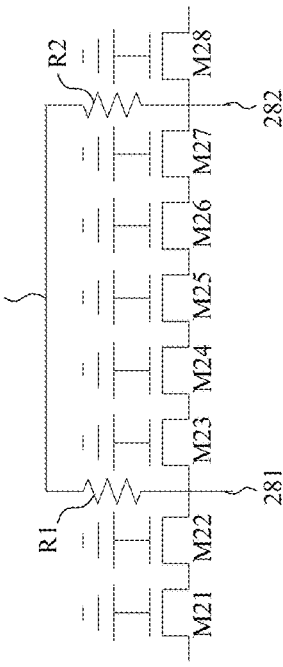
Fig. 2B
Fig. 2C

INTEGRATED CIRCUIT DEVICE HAVING ACTIVE REGION COUPLED TO METAL LAYERS ON OPPOSITE SIDES OF SUBSTRATE, AND METHOD

PRIORITY CLAIM

The present application claims the priority of U.S. Provisional Application No. 63/025,519, filed May 15, 2020, which is incorporated herein by reference in its entirety.

BACKGROUND

An integrated circuit (IC) device includes a number of semiconductor devices represented in an IC layout diagram. An IC layout diagram is hierarchical and includes modules which carry out higher-level functions in accordance with the semiconductor device design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a schematic top plan view, and FIG. 2C is a schematic circuit diagram of an IC device, in accordance with some embodiments.

DETAILED DESCRIPTION

Figure 1A:
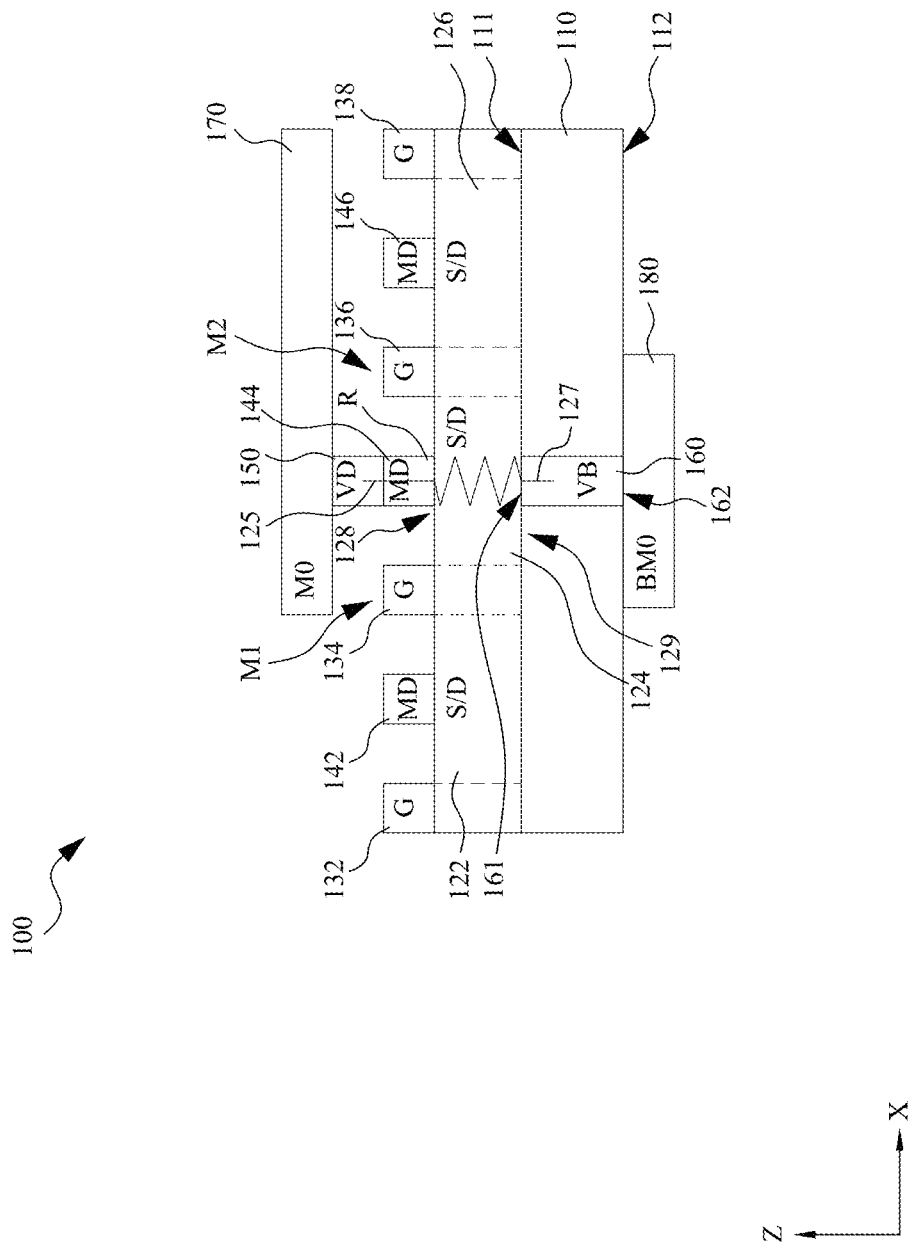
FIG. 1A is a schematic cross-sectional view and FIG. 1B is a schematic top plan view of an IC device, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Resistors are included in IC devices, for example, in analog applications or operation modes. In some embodiments, an IC device comprises a resistor structure configured at least in part by an active region over a first side of a substrate. A through via structure extends from an opposite, second side of the substrate, through the substrate into electrical contact with the active region. A first metal layer over the first side of the substrate is electrically coupled to the active region. A second metal layer under the second side of the substrate is electrically coupled to the through via structure. The first metal layer and second metal layer electrically couple the resistor structure with other circuit elements of the IC device or with external circuitry. In at least one embodiment, it is possible to include one or more resistors in an IC device, without requiring an additional mask in the manufacturing process. In contrast, in other approaches where a resistor is included in an IC device in the form of a high density metal-inter (or insulator)-metal (MIM) structure, an additional mask is required. As a result, in some embodiments, the manufacturing time, cost or complexity is reduced compared to the other approaches.

Figure 1B:
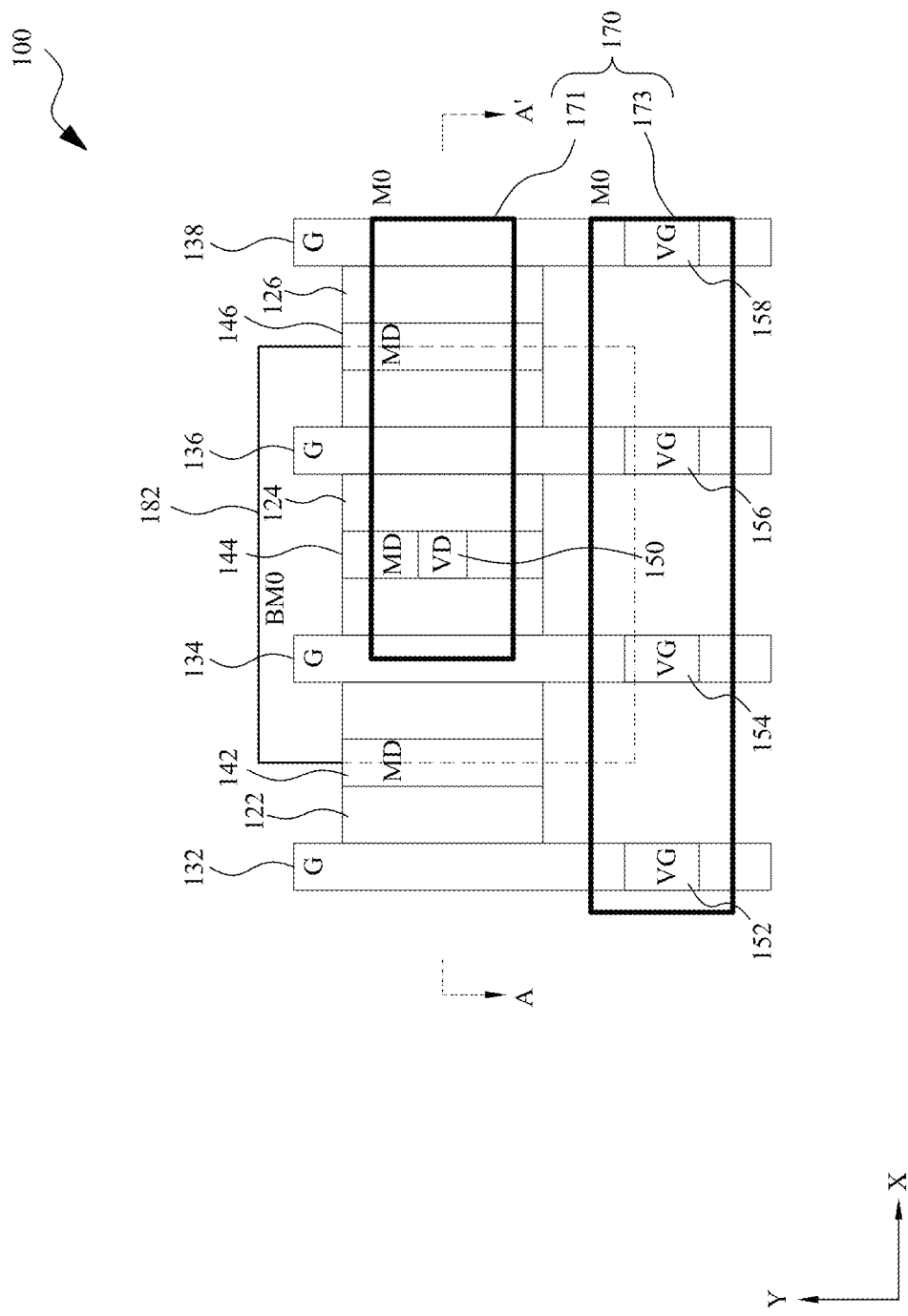

FIG. 1A is a schematic cross-sectional view and FIG. 1B is a schematic top plan view of an IC device 100, in accordance with some embodiments. More specifically, FIG. 1A is the cross-sectional view taken along line A-A' in FIG. 1B.

As illustrated in FIG. 1A, the IC device 100 comprises a substrate 110 having a first side 111 and a second side 112 opposite one another. In at least one embodiment, the first side 111 is referred to as "upper side" or "front side" or "device side," whereas the second side 112 is referred to as "lower side" or "back side." In some embodiments, the substrate 110 is a semiconductor substrate as described herein. In some embodiments, N-type and P-type dopants are added to the substrate to form N wells and P wells, respectively. In some embodiments, isolation structures are formed between adjacent P wells and N wells. For simplicity, several features such as N wells, P wells, and isolation structures are omitted from FIG. 1A.

The IC device 100 further comprises at least one active region over the first side 111 of the substrate 110. Active regions are sometimes referred to as oxide-definition (OD) regions or source/drain regions, and are schematically illustrated in the drawings with the label "S/D." In the example configuration in FIG. 1A, active regions 122, 124, 126 are over the first side 111 of the substrate 110. The active regions 122, 124, 126 are arranged along a first direction, or X direction, as indicated in FIGS. 1A, 1B. The active regions 122, 124, 126 include P-type dopants and/or N-type dopants to form one or more circuit elements or devices. Examples of circuit elements include, but are not limited to, transistors and diodes. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), etc.), FinFETs, planar MOS transistors with raised source/drains, nanosheet FETs, nanowire FETs, or the like. An active region configured to form one or more PMOS devices is sometimes referred to as "PMOS active region," and an active region configured to form one or more NMOS devices is sometimes referred to as "NMOS active region." In the example configuration described with respect to FIG. 1A, the active regions 122, 124, 126 comprise NMOS active regions. Other configurations are within the scopes of various embodiments.

At least one of the active regions of the IC device 100 is configured as a resistor structure. For example, the active region 124 is configured as a resistor structure R having opposite upper and lower ends 125, 127, as schematically illustrated in FIG. 1A. The upper end 125 of the resistor structure R corresponds to a first surface (or upper surface) 128 of the active region 124. The lower end 127 of the resistor structure R corresponds to a second surface (or lower surface) 129 of the active region 124. In at least one embodiment, the active region 124 has the same configuration as the other active regions 122, 126, which are not configured as resistor structures but form corresponding transistors as described herein. It is the electrical connections to the opposite first and second surfaces 128, 129 of the active region 124 that configure the active region 124 as the resistor structure R.

The IC device 100 further comprises at least one gate region over the one or more active regions on the first side 111 of the substrate 110. Gate regions are schematically illustrated in the drawings with the label "G." In the example configuration in FIG. 1A, gate regions 132, 134, 136, 138 are over the active regions 122, 124, 126, and arranged along the X direction. As illustrated in FIG. 1B, the gate regions 132, 134, 136, 138 extend along a second direction, i.e., Y direction, which is transverse to the X direction. The gate regions 132, 134, 136, 138 comprise a conductive material, such as, polysilicon, which is sometimes referred to as "poly" or "PO." The Y direction is sometimes referred to as the Poly direction. Other conductive materials for the gate regions, such as metals, are within the scope of various embodiments. The IC device 100 further comprises a gate dielectric or gate oxide between an active region and a corresponding gate region. For simplicity, gate oxides are omitted from FIG. 1A.

The IC device 100 further comprises at least one transistor configured by one or more gate regions and one or more active regions. For example, the gate region 134, a source/drain region in the active region 122, and another source/drain region in the active region 124 together are configured as a transistor M1. In another example, the gate region 136, a source/drain region in the active region 124, and another source/drain region in the active region 126 together are configured as a transistor M2. In some embodiments, the transistors M1, M2 are NMOS transistors. Other configurations are within the scopes of various embodiments. In some embodiments, the transistors M1, M2 are referred to as spacer transistors which are not configured for a logic operation or for signal processing. In one or more embodiments, a purpose of spacer transistors is to maintain a distance between adjacent resistor structures, or between a resistor structure and other circuit elements, e.g., satisfying a design rule or for manufacturability.

The IC device 100 further comprises one or more contact structures over and in electrical contact with one or more corresponding active regions. Contact structures are sometimes referred to as metal-zero-over-oxide or metal-to-device structures, and are schematically illustrated in the drawings with the label "MD." An MD contact structure includes a conductive material formed over a corresponding active region to define an electrical connection from one or more devices formed in the active region to other internal circuitry of the IC or to outside circuitry. In the example configuration in FIG. 1A, contact structures 142, 144, 146 are over and in electrical contact with the corresponding active regions 122, 124, 126. The contact structures 142, 144, 146 are arranged alternatively with gate regions 132, 134, 136, 138 in the X direction. An example conductive material of the contact structures 142, 144, 146 includes metal. Other configurations are within the scopes of various embodiments.

The IC device 100 further comprises one or more via structures over and in electrical contact with the corresponding one or more gate regions or contact structures. A via structure over and in electrical contact with a contact structure is sometimes referred to as via-to-device, and is schematically illustrated in the drawings with the label "VD." A via structure over and in electrical contact with a gate region is sometimes referred to as via-to-gate, and is schematically illustrated in the drawings with the label "VG." In the example configuration in FIG. 1A, a VD via structure 150 is over and in electrical contact with the contact structure 144. One or more other VD via structures are over and in electrical contact with the corresponding contact structures 142, 146 for electrical connections to the source/drain regions of the transistors M1, M2. For simplicity, VD via structures corresponding to the contact structures 142, 146 are omitted from FIG. 1A, 1B. As illustrated in FIG. 1B, VG via structures 152, 154, 156, 158 are over and in electrical contact with the corresponding gate regions 132, 134, 136, 138. In at least one embodiment, VD and VG via structures belong to a via-zero (V0) layer which is the lowermost via layer over, or the closest via layer to, the active regions 122, 124, 126, on the first side 111 of the substrate 110. An example material of the via structures 150, 152, 154, 156, 158 includes metal. Other configurations are within the scopes of various embodiments.

The IC device 100 further comprises a through via structure extending through the substrate 110 in electrical contact with an active region configuring a resistor structure. A through via structure is sometimes referred to as backside via, and is schematically illustrated in the drawings with the label "VB." In the example configuration in FIG. 1A, a through via structure 160 extends in a thickness direction of the substrate 110, i.e., Z direction, from the second side 112, through the substrate 110, to the first side 111 in electrical contact with the active region 124 that is configured as the resistor structure R. In at least one embodiment, a first surface 161 of the through via structure 160 on the first side 111 of the substrate 110 is in direct contact with the second surface 129 of the active region 124, whereas a second surface 162 of the through via structure 160 is exposed on the second side 112 of the substrate 110 for electrical contact with a metal layer as described herein. An example material of the through via structure 160 includes metal. Other configurations are within the scopes of various embodiments.

The IC device 100 further comprises a metal-zero (M0) layer 170 over the first side 111 of the substrate 110. The M0 layer 170 is the lowermost metal layer over, or the closest metal layer to, the active regions 122, 124, 126, on the first side 111 of the substrate 110. The IC device 100 further comprises a dielectric layer between the M0 layer 170 and the active regions 122, 124, 126. In at least one embodiment, the IC device 100 comprises one or more further via layers, dielectric layers and metal layers (not shown) over the M0 layer 170 to form interconnections among circuit elements of the IC device 100 and/or to form electrical connections to external circuitry. Via layers from the V0 layer and above and metal layers from the M0 layer and above are sometimes referred to as front-side via layers and metal layers. For simplicity, dielectric layers as well as front-side via and metal layers higher than the M0 layer 170 are omitted from FIG. 1A. In the example configuration in FIG. 1B, the M0 layer 170 comprises M0 conductive patterns 171, 173. The M0 conductive pattern 171 is over and electrically coupled to the active region 124 through the via structure 150 and the contact structure 144. The M0 conductive pattern 173 is over and electrically coupled to the gate regions 132, 134, 136, 138 through the corresponding via structures 152, 154, 156, 158. In some embodiments, one or more of the via structures 152, 154, 156, 158 are omitted, resulting on one or more of the corresponding gate regions 132, 134, 136, 138 being floating, as described herein. In at least one embodiment, the M0 layer 170 comprises one or more further M0 conductive patterns electrically coupled to one or more of the active regions 122, 126 through one or more of the corresponding contact structures 142, 146 and one or more corresponding VD via structures (not shown).

The IC device 100 further comprises a backside-metal-zero (BM0) layer 180 under the second side 112 of the substrate 110. The BM0 layer 180 is the uppermost metal layer under, or the closest metal layer to, the active regions 122, 124, 126, on the second side 112 of the substrate 110. In at least one embodiment, the BM0 layer 180 is in direct contact with the second side 112 of the substrate 110. In at least one embodiment, the IC device 100 comprises one or more further via layers, dielectric layers and metal layers (not shown) under the BM0 layer 180 to form interconnections among circuit elements of the IC device 100 and/or to form electrical connections to external circuitry. Via layers and metal layers from the BM0 layer and below are sometimes referred to as backside via layers and metal layers. For simplicity, dielectric layers, and backside via and metal layers lower than the BM0 layer 180 are omitted from FIG. 1A. In at least one embodiment, the BM0 layer 180 or one or more other metal layers (not shown) under the BM0 layer 180 comprise one or more power supply voltage rails (also referred to as "power rails") for supplying one or more power supply voltages to circuit elements of the IC device 100. The BM0 layer 180 comprises a BM0 conductive pattern 182 (illustrated in FIG. 1B) which is under and electrically coupled to the through via structure 160 as illustrated in FIG. 1A. In at least one embodiment, the BM0 conductive pattern 182 is in direct contact with the second surface 162 of the through via structure 160.

In FIG. 1B, for simplicity, the substrate 110 and the through via structure 160 are omitted. In at least one embodiment, the top plan view in FIG. 1B represents an IC layout diagram in accordance with which the IC device 100 is manufactured. In the top plan view of FIG. 1B, which is seen along the thickness direction (Z direction in FIG. 1A) of the substrate 110 from the first side 111 to the second side 112, the M0 conductive pattern 171, via structure 150, contact structure 144, active region 124, through via structure 160 (not shown in FIG. 1B), and the BM0 conductive pattern 182 overlap one another. Other configurations are within the scopes of various embodiments.

As described herein, the resistor structure R is at least partially configured by the active region 124. The upper end 125 of the resistor structure R corresponds to the first surface 128 of the active region 124, and is electrically coupled with other circuit elements of the IC device 100, or with external circuitry, through the contact structure 144, via structure 150 and M0 conductive pattern 171 in the M0 layer 170. In at least one embodiment, the contact structure 144 is in direct contact with the first surface 128 of the active region 124. The lower end 127 of the resistor structure R corresponds to the second surface 129 of the active region 124, and is electrically coupled with other circuit elements of the IC device 100, or with external circuitry, through the through via structure 160 and BM0 conductive pattern 182 in the BM0 layer 180. In at least one embodiment, the through via structure 160 is in direct contact with the second surface 129 of the active region 124. The described configuration of the M0 layer 170 and the BM0 layer 180 to provide electrical connections to the resistor structure R is an example. In at least one embodiment, one or more other metal layers over the M0 layer 170 or under the BM0 layer 180 are configured to provide electrical connections to the resistor structure R. In one or more embodiments, resistance of the resistor structure R is from about 100 ohm to about 2000 ohm.

In some embodiments, in addition to the resistor structure R, the IC device 100 further comprises at least one MIM resistor on the front side. The at least one MIM resistor comprises a resistive material having a resistivity higher than 5 µohm-cm sandwiched between two metal layers higher than the M0 layer 170. In some embodiments, the resistive material comprises at least one material selected from the group consisting of W, TiN, TaN, Co, Mn, Ru, Ta, TiW, Ta—Si—N, TiZrN, CoTix, Mo, AlC, TiGeN, Cr, CrAsC, TiAlC, and WNx.

As described herein, in at least one embodiment, it is possible to include the resistor structure R in the IC device 100, without requiring an additional mask in the manufacturing process. A reason is it is possible to form the resistor structure R configured at least partially by the active region 124 together with the other active regions of the IC device 100, without an additional mask. Further, it is possible to form electrical connections to the resistor structure R through one or more of the contact structure 144, via structure 150, M0 conductive pattern 171, through via structure 160 and BM0 conductive pattern 182, together with other contact structures, via structures and metal layers of the IC device 100, without an additional mask. For example, in at least one embodiment, the BM0 layer 180 and/or other metal layers under the BM0 layer 180 include backside power supply voltage rails, i.e., power supply voltage rails on the backside of the substrate 110. Additional through via structures (not shown) are also formed through the substrate 110 to supply power from the backside power supply voltage rails to the devices or circuit elements on the front side or device side of the substrate 110. In some embodiments, it is possible to form the BM0 conductive pattern 182 together with the backside power supply voltage rails, without an additional mask. It is further possible to form the through via structure 160 together with the additional through via structures, without an additional mask. In contrast, in other approaches where a resistor is included in an IC device in the form of a high density metal-inter (or insulator)-metal (MIM) structure, an additional mask is required to form the insulator. As a result, because an additional mask is not required in some embodiments, the manufacturing time, cost or complexity is reduced compared to the other approaches.

In at least one embodiment, adjacent transistors on opposite sides of a resistor structure are electrically coupled to be in an always-OFF state, or have floating gate regions. For example, as best seen in FIG. 1A, the transistors M1, M2 are adjacent transistors on opposite sides of the resistor structure R. In one or more embodiments, the gate regions 134, 136 of the transistors M1, M2 are floating, i.e., the gate regions 134, 136 are not electrically coupled to a power rail, signal node, or other circuit elements. In some embodiments, the transistors M1, M2 are electrically coupled to be in an always-OFF state, i.e., to be always turned OFF during operation of the IC device 100, or when power is supplied to the IC device 100. In the example configuration in FIG. 1A, the transistors M1, M2 are NMOS transistors, and are electrically coupled to be in the always-OFF state by electrically coupling the corresponding gate regions 134, 136 of the transistors M1, M2 to a ground voltage, i.e., VSS. This is done, for example, as illustrated in FIG. 1B where the gate regions 134, 136 are electrically coupled through the corresponding via structures 154, 156 to the M0 conductive pattern 173 which is configured as a VSS power rail, i.e., a power rail having the ground voltage VSS. In other configurations where the transistors M1, M2 are PMOS transistors, the transistors M1, M2 are electrically coupled to be in the always-OFF state by electrically coupling the corresponding gate regions 134, 136 of the transistors M1, M2 to a power rail having a positive power supply voltage, i.e., VDD. This is done, for example, by configuring the M0 conductive pattern 173 as a VDD power rail.

In some embodiments, the adjacent transistors to be coupled in the always-OFF state or to have floating gate regions comprise not only the transistors immediately adjacent the resistor structure, but also other transistors in a vicinity of the resistor structure. In at least one embodiment, the adjacent transistors comprise more than one transistor on each side of the resistor structure. For example, the adjacent transistors comprise further transistors (not numbered) having the gate regions 132, 138 which are configured in a similar manner to the transistors M1, M2 to be coupled in the always-OFF state or to have floating gate regions.

In some embodiments, whether to configure the transistors adjacent to a resistor structure to have floating gate regions or to be coupled in the always-OFF state is a design consideration.

In at least one embodiment where a high speed operation of the IC device 100 is not a consideration or requirement, the transistors M1, M2 are electrically coupled to be in the always-OFF state, for example, by electrically coupling the gate regions 134, 136 to VSS. As a result, parasitic capacitances of the always-OFF transistors M1, M2 are increased. In one or more embodiments, the increased parasitic capacitances provide decoupling capacitances useful in one or more applications or operation modes of the IC device 100. As a result, it is possible to reduce a chip or wafer area designated for specifically configured decoupling capacitors, in at least one embodiment.

In at least one embodiment, where a high speed operation of the IC device 100 is a consideration or requirement, the transistors M1, M2 are configured to have floating gate regions 134, 136. As a result, parasitic capacitances around the resistor structure R are decreased. The decreased parasitic capacitances permit signal transmissions through, or in a vicinity of, the resistor structure R to be performed at a high speed. This configuration is useful in analog applications or operation modes of the IC device 100, in one or more embodiments.

Figure 2A:
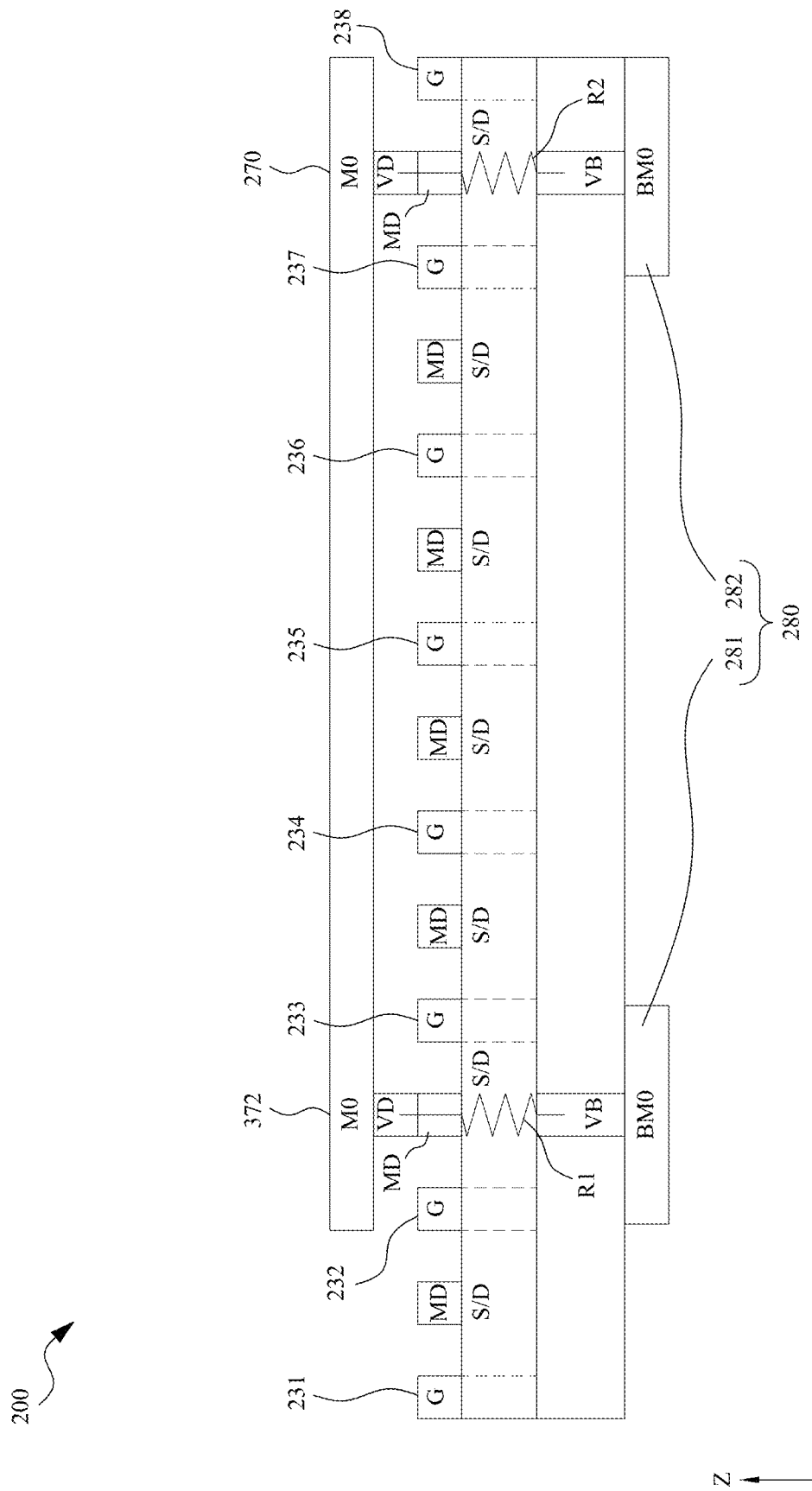
FIG. 2A is a schematic cross-sectional view.

FIG. 2A is a schematic cross-sectional view, FIG. 2B is a schematic top plan view, and FIG. 2C is a schematic circuit diagram of an IC device 200, in accordance with some embodiments. FIG. 2A is a cross-sectional view similar to FIG. 1A, and FIG. 2B is a top plan view similar to FIG. 1B. Descriptions of some components in FIGS. 2A-2B that are similar to corresponding components in FIGS. 1A-1B are omitted for simplicity.

A difference from the IC device 100 is that the IC device 200 comprises two resistor structures R1, R2 each corresponding to the resistor structure R of the IC device 100. As shown in FIGS. 2A-2C, the IC device 200 comprises an M0 layer 270 having an M0 conductive pattern 271 that electrically couples upper ends (not numbered) of the resistor structures R1, R2 in series. The IC device 200 further comprises an BM0 layer 280 having BM0 conductive patterns 281, 282 electrically coupled to corresponding lower ends (not numbered) of the resistor structures R1, R2. As shown in FIGS. 2A-2B, the IC device 200 further comprises a plurality of gate regions 231-238 which correspond to a plurality of transistors M21-M28 as shown in FIG. 2C. In at least one embodiment, the transistors M21-M28 are spacer transistors. The transistors M21-M28 comprise adjacent transistors on opposite sides of each of the resistor structures R1, R2, as well as the transistors between the resistor structures R1, R2. As shown in FIG. 2C, the transistors M21-M28 are all electrically coupled to be in the always-OFF state, for example, by electrically coupling the gate regions 231-238 to VS S. This is done, for example, as indicated in FIG. 2B, by the gate regions 231-238 electrically coupled through corresponding VG via structures to an M0 conductive pattern 273 in the M0 layer 270. The M0 conductive pattern 273 is configured as a VSS power rail. The described number of transistors between the resistor structures R1, R2 is an example. Other number of transistors between the resistor structures R1, R2 are within the scopes of various embodiments.

In at least one embodiment, one or more advantages described herein are achievable in the IC device 200. For example, the always-OFF transistors M21-M28 provide decoupling capacitances, especially in the region between resistor structures R1, R2. As a result, it is possible to reduce a chip or wafer area designated for specifically configured decoupling capacitors, in at least one embodiment.

Figure 3A:
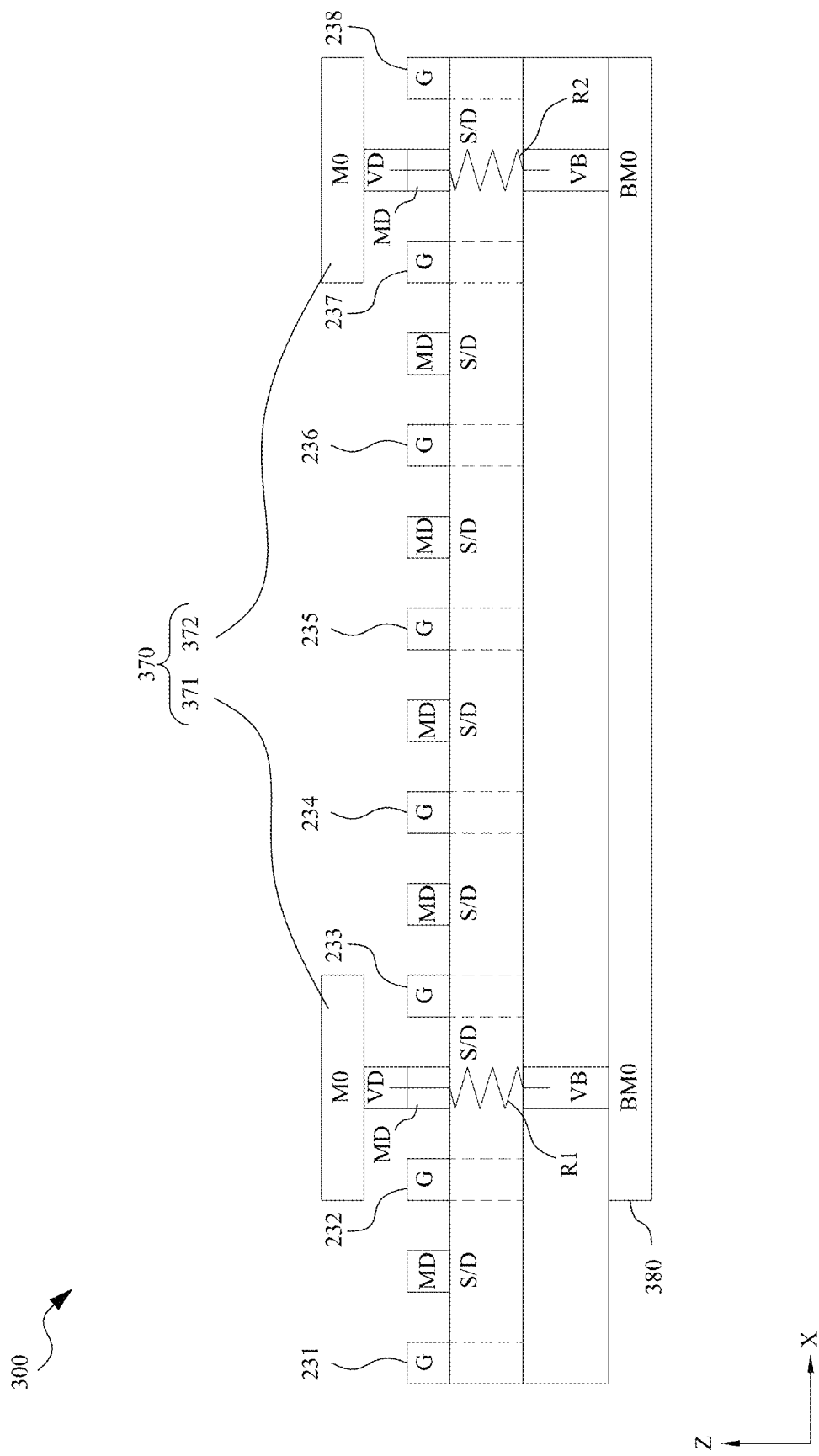
FIG. 3A is a schematic cross-sectional view.
Figure 3B:
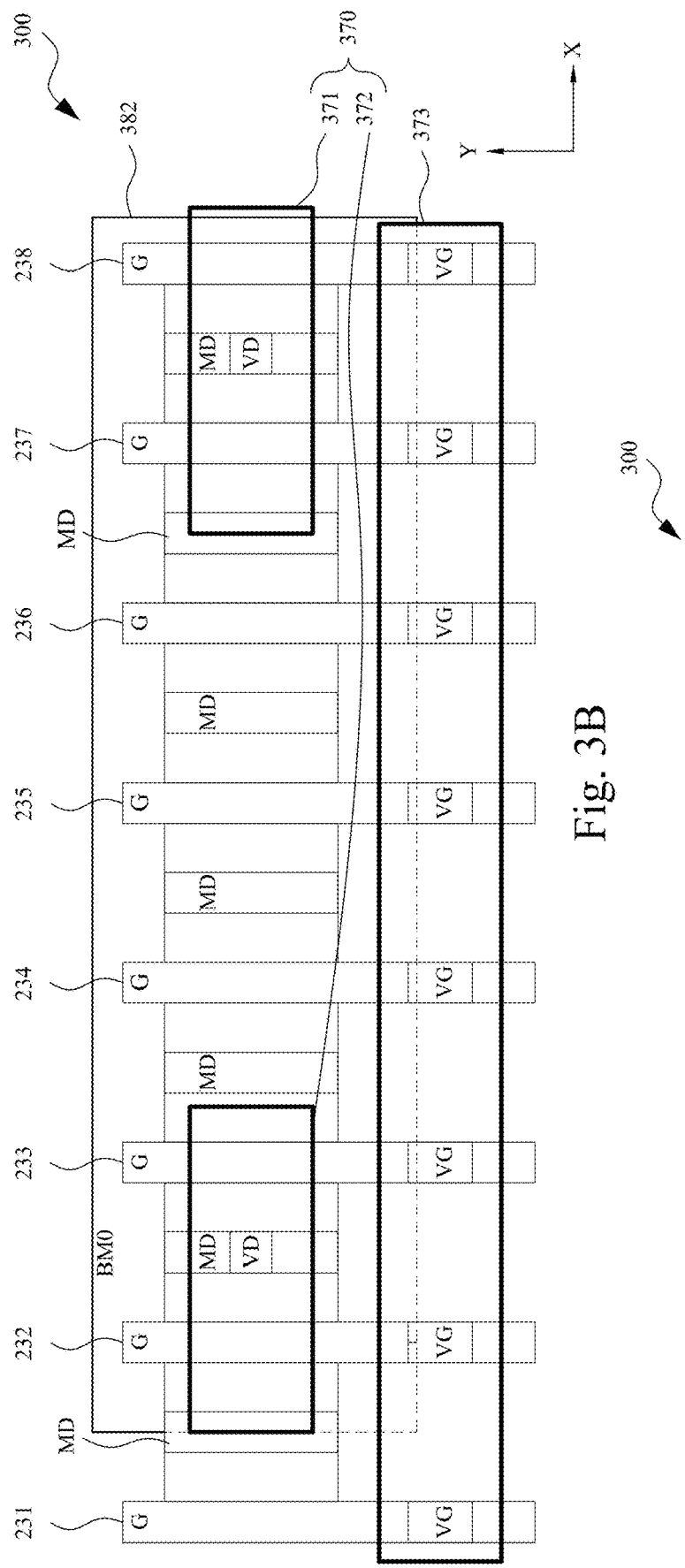
FIG. 3B is a schematic top plan view.
Figure 3C:
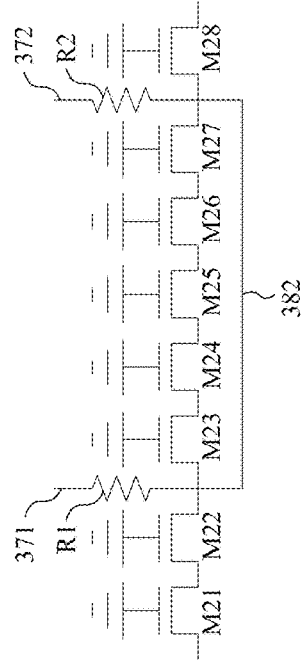
FIG. 3C is a schematic circuit diagram of an IC device, in accordance with some embodiments.

FIG. 3A is a schematic cross-sectional view, FIG. 3B is a schematic top plan view, and FIG. 3C is a schematic circuit diagram of an IC device 300, in accordance with some embodiments. FIG. 3A is a cross-sectional view similar to FIG. 2A, and FIG. 3B is a top plan view similar to FIG. 2B. Descriptions of some components in FIGS. 3A-3C that are similar to corresponding components in FIGS. 1A-1B, 2A-2C are omitted for simplicity.

Similarly to the IC device 200, the IC device 300 comprises two resistor structures R1, R2 each corresponding to the resistor structure R of the IC device 100. A difference from the IC device 200 is that, in the IC device 300, the resistor structures R1, R2 are electrically coupled in series in a backside metal layer BM0, rather than in a metal layer M0 as in the IC device 200. For example, as shown in FIGS. 3A-3C, the IC device 300 comprises an M0 layer 370 having M0 conductive patterns 371, 372 electrically coupled to corresponding upper ends (not numbered) of the resistor structures R1, R2. The IC device 300 further comprises an BM0 layer 380 having a BM0 conductive pattern 382 that electrically couples lower ends (not numbered) of the resistor structures R1, R2 in series. Similarly to the IC device 200, the transistors M21-M28 are all electrically coupled to be in the always-OFF state. This is done, for example, as indicated in FIG. 3B, by the gate regions 231-238 electrically coupled through corresponding VG via structures to an M0 conductive pattern 373 in the M0 layer 370. The M0 conductive pattern 373 is configured as a VSS power rail. In at least one embodiment, one or more advantages described herein with respect to the IC device 200 are achievable in the IC device 300.

Figure 4A:
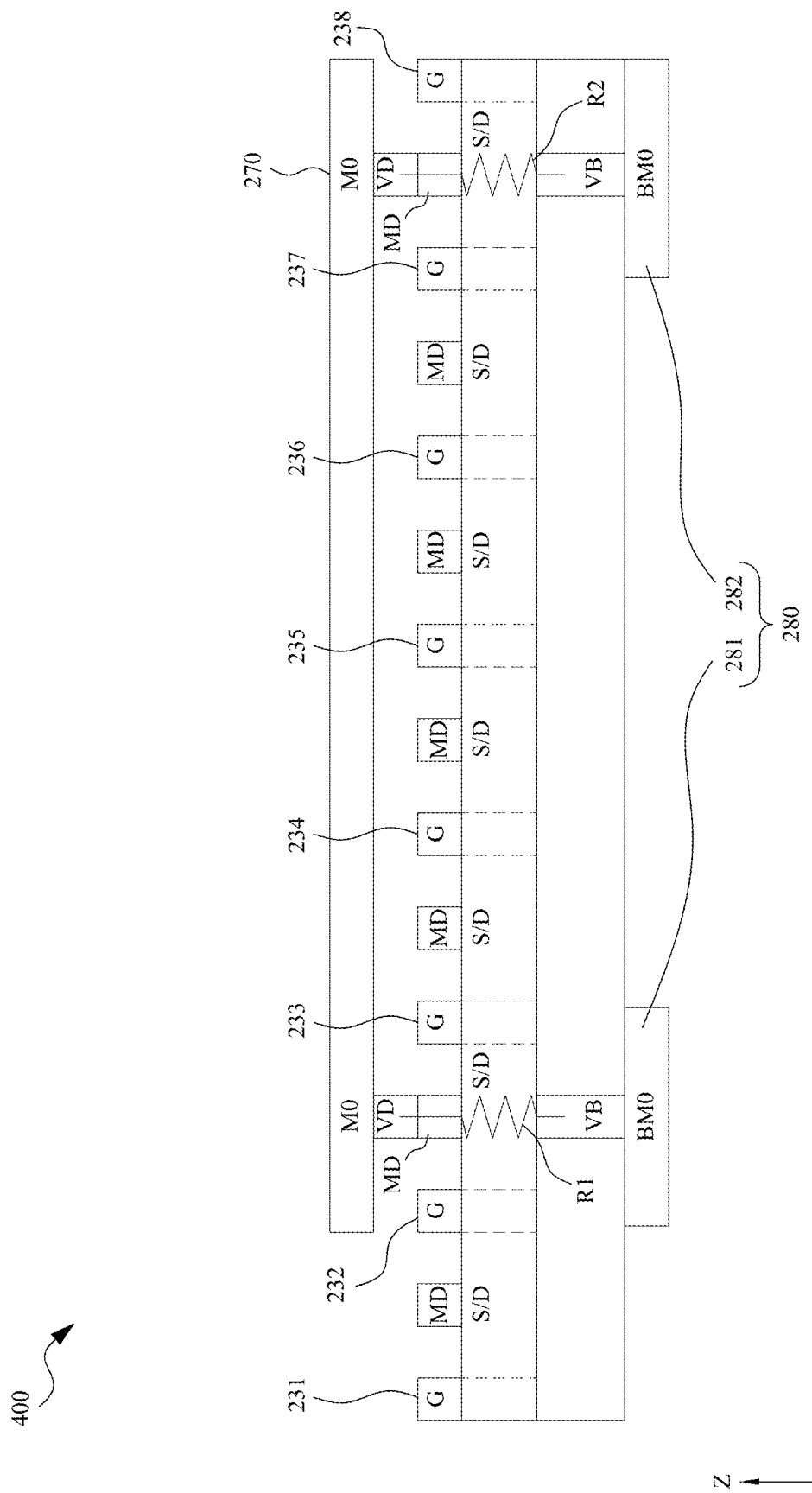
FIG. 4A is a schematic cross-sectional view.
Figure 4B:
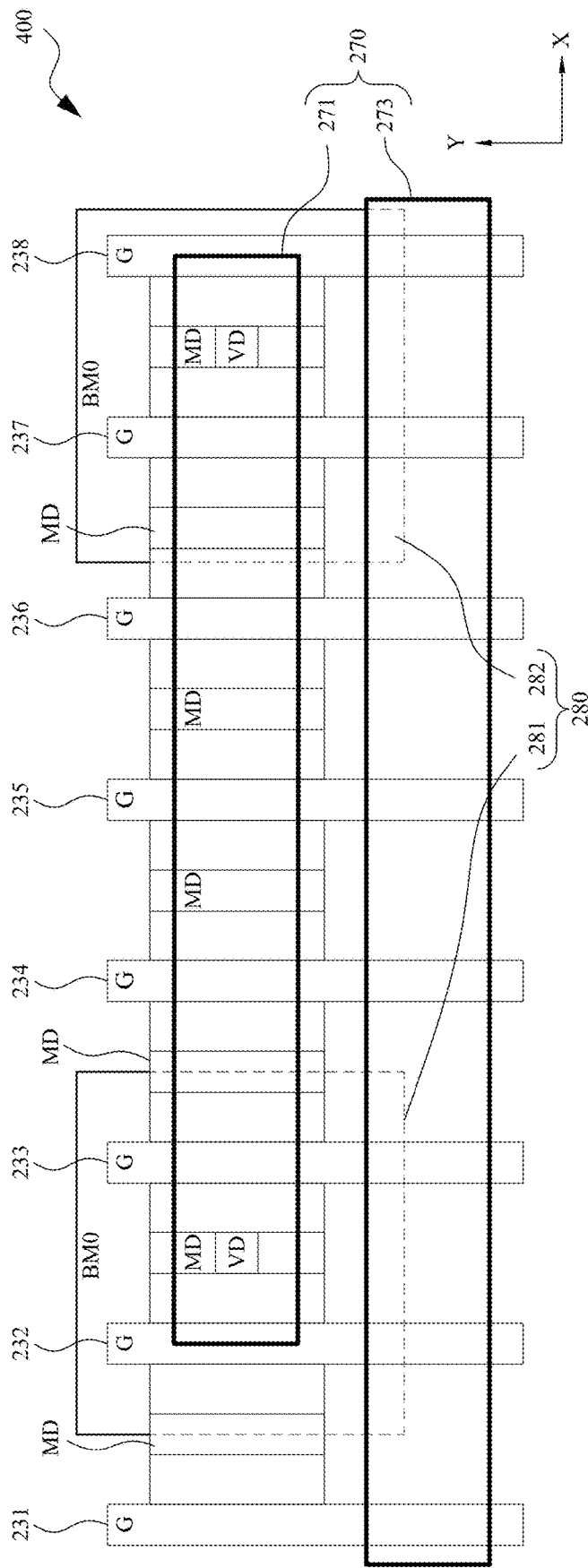
FIG. 4B is a schematic top plan view.
Figure 4C:
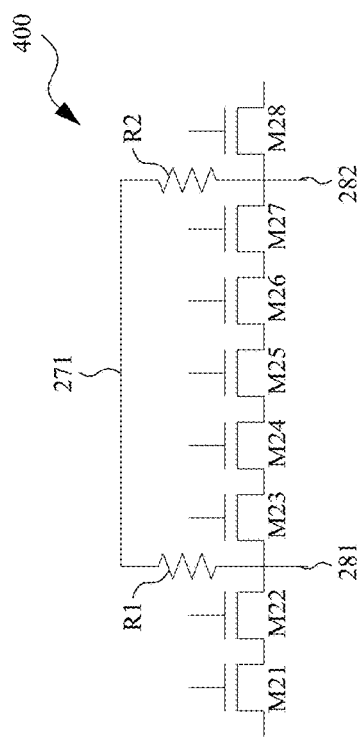
FIG. 4C is a schematic circuit diagram of an IC device, in accordance with some embodiments.

FIG. 4A is a schematic cross-sectional view, FIG. 4B is a schematic top plan view, and FIG. 4C is a schematic circuit diagram of an IC device 400, in accordance with some embodiments. FIG. 4A is a cross-sectional view similar to FIG. 2A, and FIG. 4B is a top plan view similar to FIG. 2B. Descriptions of some components in FIGS. 4A-4C that are similar to corresponding components in FIGS. 1A-1B, 2A-2C are omitted for simplicity.

A difference from the IC device 200 is that, in the IC device 400 the transistors M21-M28 are configured to have floating gate regions 231-238, as shown in FIG. 4C. This is done, for example, as indicated in FIG. 4B where VG via structures between the gate regions 231-238 and the M0 conductive pattern 273 configured as a VSS power rail are omitted. In some embodiments, the M0 conductive pattern 273 is also omitted. In at least one embodiment, one or more advantages described herein are achievable in the IC device 400. For example, the transistors M21-M28 with floating gate regions 231-238 reduce or minimize parasitic capacitances in the region between the resistor structures R1, R2. As a result, it is possible to perform high speed signal transmissions through, or in a vicinity of, the resistor structures R1, R2, in one or more embodiments.

Figure 5A:
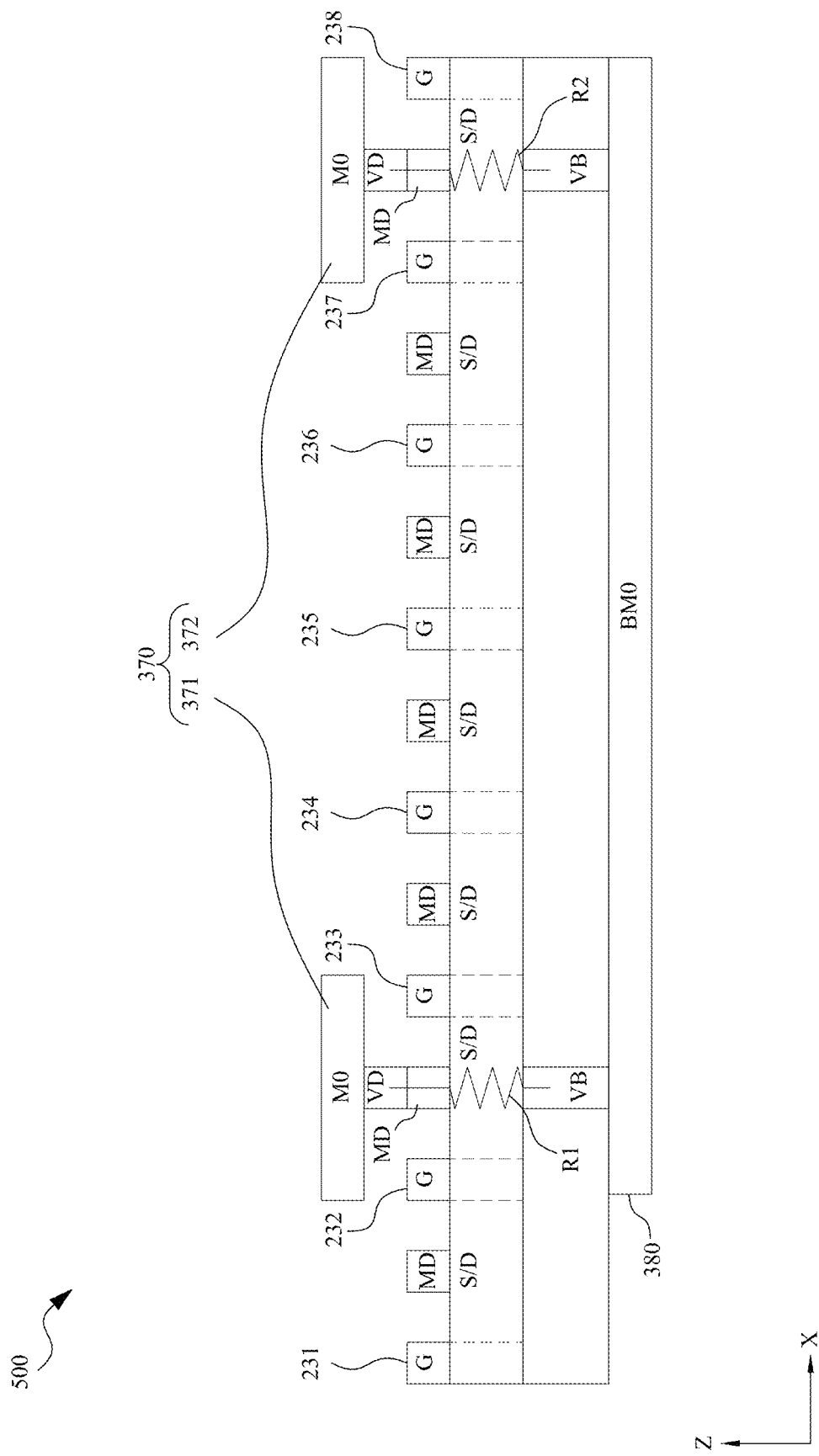
FIG. 5A is a schematic cross-sectional view.
Figure 5B:
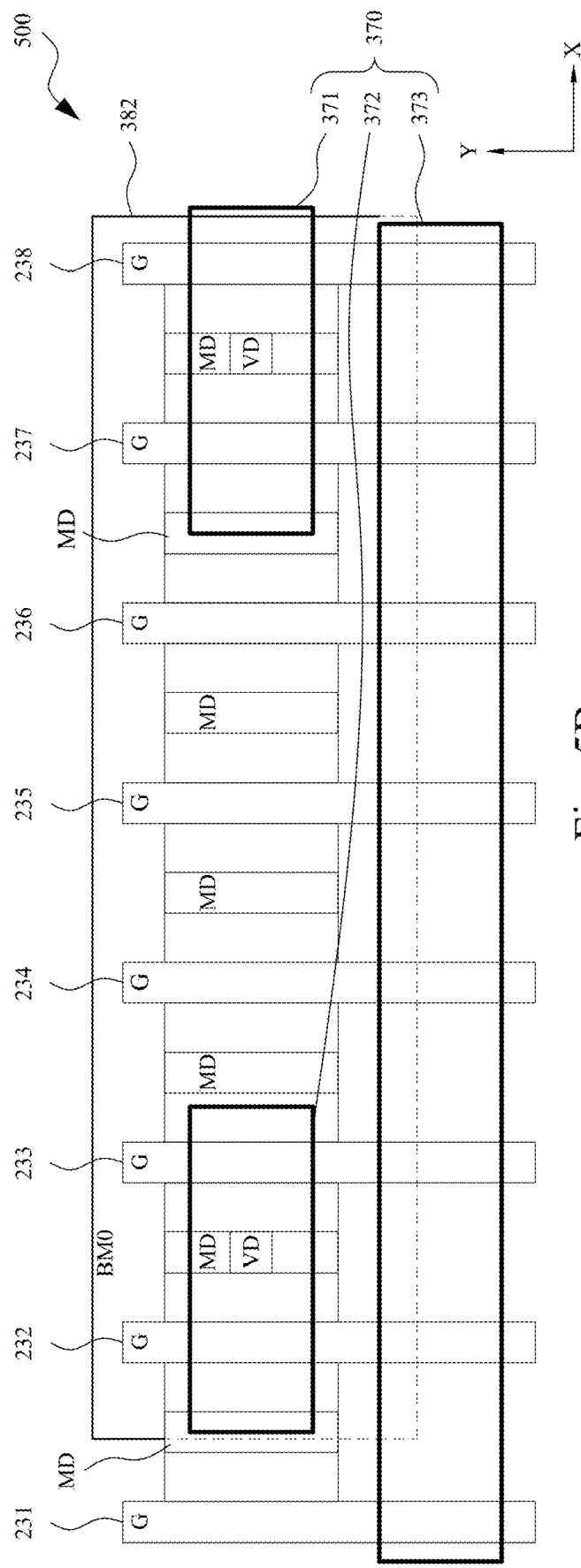
FIG. 5B is a schematic top plan view.
Figure 5C:
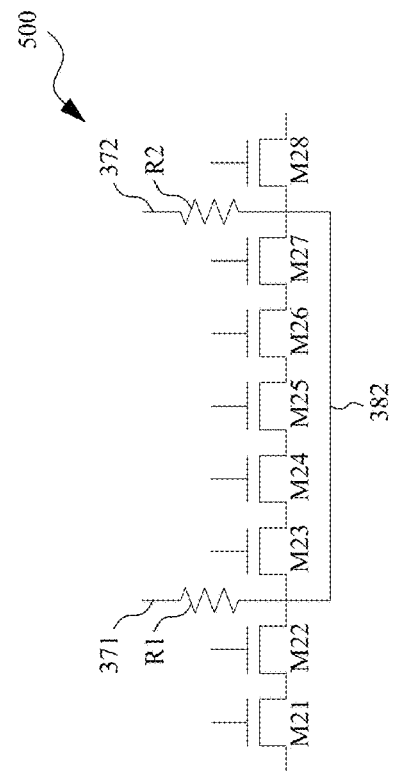
FIG. 5C is a schematic circuit diagram of an IC device, in accordance with some embodiments.

FIG. 5A is a schematic cross-sectional view, FIG. 5B is a schematic top plan view, and FIG. 5C is a schematic circuit diagram of an IC device 500, in accordance with some embodiments. FIG. 5A is a cross-sectional view similar to FIG. 3A, and FIG. 5B is a top plan view similar to FIG. 3B. Descriptions of some components in FIGS. 5A-5C that are similar to corresponding components in FIGS. 1A-1B, 3A-3C are omitted for simplicity.

A difference from the IC device 300 is that, in the IC device 500 the transistors M21-M28 are configured to have floating gate regions 231-238, as shown in FIG. 5C. This is done, for example, as indicated in FIG. 5B where VG via structures between the gate regions 231-238 and the M0 conductive pattern 373 configured as a VSS power rail are omitted. In some embodiments, the M0 conductive pattern 373 is also omitted. In at least one embodiment, one or more advantages described herein with respect to the IC device 400 are achievable in the IC device 500.

Figure 6A:
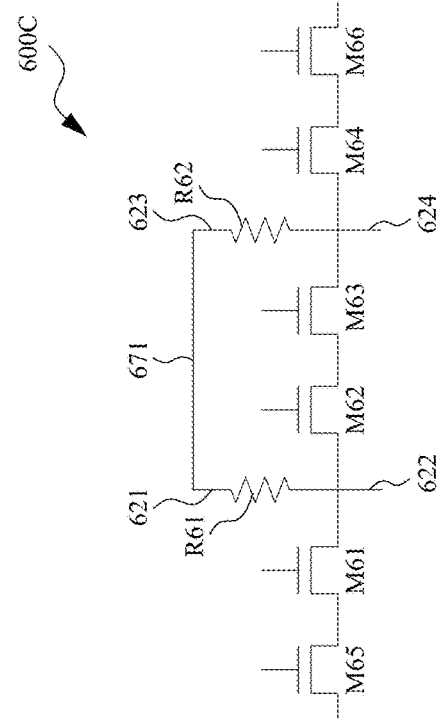
FIGS. 6A-6D are schematic circuit diagrams of various resistors, in accordance with some embodiments.
Figure 6C:
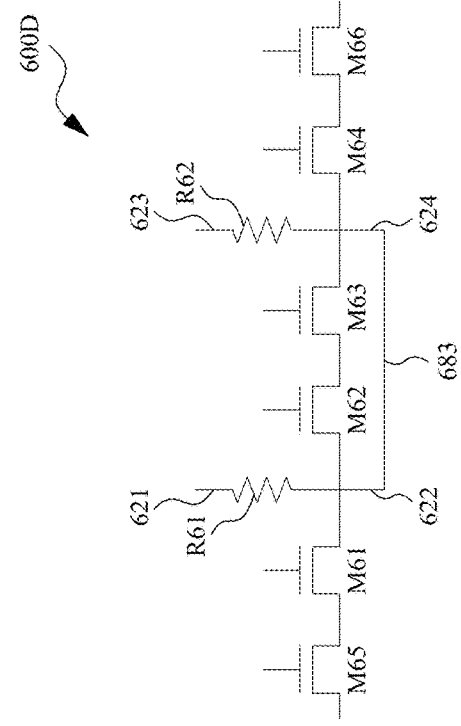
Figure 6B:
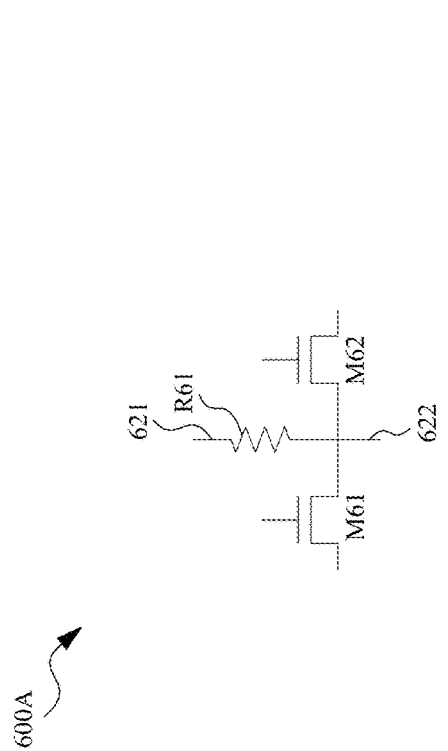
Figure 6D:
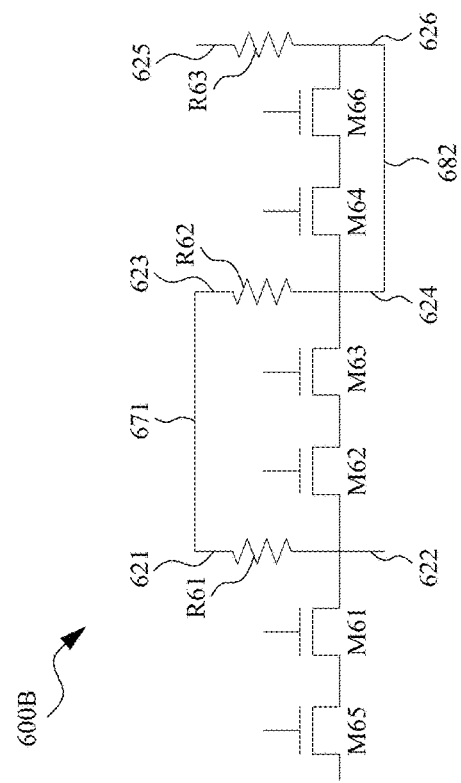

FIGS. 6A-6D are schematic circuit diagrams of various resistors 600A-600D, in accordance with some embodiments. In some embodiments, one or more of the resistors 600A-600D are configured as resistor cells in a cell library stored in a non-transitory computer-readable medium. In an example place-and-route operation by an EDA tool, resistor cells are accessed from the cell library and placed in an IC layout diagram, and then conductive patterns or interconnects are routed to connect the placed resistors with each other to achieve an intended resistance, and also with other circuit elements in the IC layout diagram. Each of the resistors 600A-600D comprises one or more resistor structures and a plurality of spacer transistors (hereinafter "transistors" for simplicity). In a resistor 600B-600D with more than one resistor structures, the resistor further comprises one or more internal connections connecting the resistor structures with each other. The numbers and arrangements of resistor structures, transistors and internal connections in each resistor 600A-600D are examples. Other configurations are within the scopes of various embodiments. The resistors 600A, 600B in FIGS. 6A-6B are examples of resistors having an odd number of resistor structures. The resistors 600C, 600D in FIGS. 6C-6D are examples of resistors having an even number of resistor structures.

In the example configuration in FIG. 6A, the resistor 600A comprises a resistor structure R61, and transistors M61, M62. In at least one embodiment, the resistor structure R61 corresponds to the resistor structure R, and the transistors M61, M62 correspond to the transistors M1, M2 in the IC device 100. In the resistor 600A, the transistors M61, M62 are configured to have floating gate regions. However, other configurations where the transistors M61, M62 are electrically coupled to be in an always-OFF state are within the scopes of various embodiments. The resistor structure R61 has an upper end 621 in a front-side via or metal layer, and a lower end 622 in a backside via or metal layer. For example, the upper end 621 is in the M0 layer and the lower end 622 is in the BM0 layer. The upper end 621 and lower end 622 are free ends or nodes or terminals used for routing interconnects from other circuit elements in an IC layout diagram to the resistor 600A.

In the example configuration in FIG. 6B, the resistor 600B comprises three resistor structures R61, R62, R63, transistors M61-M66, and internal connections 671, 682. In at least one embodiment, each of the resistor structures R61-R63 corresponds to the resistor structure R, and each of the transistors M61-M66 corresponds to the transistor M1 or M2 in the IC device 100. In the resistor 600B, the transistors M61-M66 are configured to have floating gate regions. However, other configurations where the transistors M61-M66 are electrically coupled to be in an always-OFF state are within the scopes of various embodiments. The resistor structures R62, R63 have corresponding upper ends 623, 625 in a front-side via or metal layer, and corresponding lower ends 624, 626 in a backside via or metal layer. For example, the upper ends 623, 625 are in the M0 layer, and the lower ends 624, 626 are in the BM0 layer. The internal connection 671 is in a front-side metal layer, and electrically couples the upper ends 621, 623 of the resistor structures R61, R62. The internal connection 682 is in a backside metal layer, and electrically couples the lower ends 624, 626 of the resistor structures R62, R63. As a result, the resistor structures R61-R63 are electrically coupled in series. For example, the internal connection 671 is in the M0 layer, and the internal connection 682 is in the BM0 layer. The lower end 622 of the resistor structure R61 and the upper end 625 of the resistor structure R63 are free ends used for routing interconnects from other circuit elements in an IC layout diagram to the resistor 600B. In a modification (not shown) in accordance with some embodiments, the lower ends 622, 624 of the resistor structures R61, R62 are electrically coupled by an internal connection in the BM0 layer, the upper ends 623, 625 of the resistor structures R62, R63 are electrically coupled by another internal connection in the M0 layer, and the upper end 621 of the resistor structure R61 and the lower end 626 of the resistor structure R63 are free ends used for routing interconnects.

A feature of resistors 600A, 600B in FIGS. 6A-6B, as well as other resistors having an odd number of resistor structures, is that one of the free ends for interconnections is on the front side whereas the other free end is on the backside. For example, in the resistor 600A, the upper end 621 of the resistor structure R61 is the free end for interconnections on the front side, and the lower end 622 is the free end for interconnections on the backside. For another example, in the resistor 600B, the upper end 625 of the resistor structure R63 is the free end for interconnections on the front side, and the lower end 622 of the resistor structure R61 is the free end for interconnections on the backside.

In the example configuration in FIG. 6C, the resistor 600C is similar to the resistor 600B, except that the resistor structure R63 and the internal connection 682 are omitted. The resistor 600C comprises two resistor structures R61, R62 electrically coupled in series by the internal connection 671. The lower ends 622, 624 of the resistor structures R61, R62 are free ends used for routing interconnects from other circuit elements in an IC layout diagram to the resistor 600C.

In the example configuration in FIG. 6D, the resistor 600D is similar to the resistor 600C, except that the resistor structures R61, R62 are electrically coupled in series, at the lower ends 622, 624, by an internal connection 683 in a backside metal layer, e.g., the BM0 layer. The upper ends 621, 623 of the resistor structures R61, R62 are free ends used for routing interconnects from other circuit elements in an IC layout diagram to the resistor 600D.

A feature of resistors 600C, 600D in FIGS. 6C-6D, as well as other resistors having an even number of resistor structures, is that the free ends for interconnections are either both on the front side, or both on the backside. For example, in the resistor 600C, the lower ends 622, 624 of the resistor structures R61, R62 are the free ends for interconnections and are both on the backside. For another example, in the resistor 600D, the upper ends 621, 623 of the resistor structures R61, R62 are the free ends for interconnections and are both on the front side.

Figure 7A:
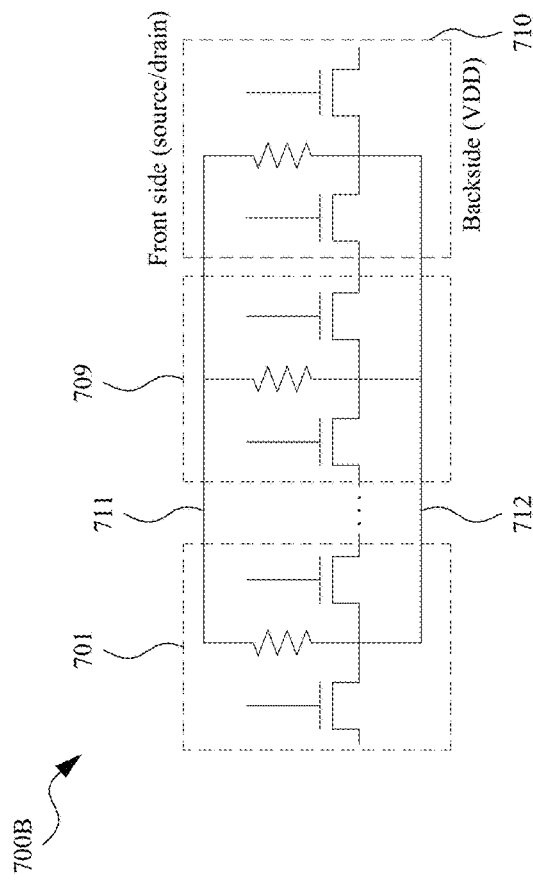
FIG. 7A is a schematic circuit diagram of an example circuit.
Figure 7B:
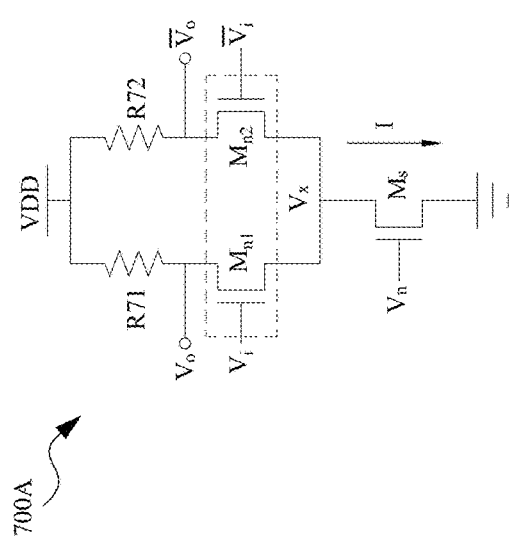
FIG. 7B is a schematic circuit diagram of a resistor, in accordance with some embodiments, to be included in the circuit.

FIG. 7A is a schematic circuit diagram of an example circuit 700A. FIG. 7B is a schematic circuit diagram of a resistor 700B, in accordance with some embodiments, to be included in the circuit 700A.

In FIG. 7A, the circuit 700A is a differential amplifier comprising a differential pair of transistors Mn1, Mn2, load resistors R71, R72, and a current source in the form of a transistor Ms. Each of the resistors R71, R72 is electrically coupled between VDD and a source/drain region of the corresponding transistor Mn1 or Mn2. In some embodiments, VDD is provided on the backside of an IC device, whereas source/drain regions are provided on the front side of the IC device. To implement at least one of the resistors R71, R72 by one or more resistors in accordance with some embodiments, a resistor having free ends for interconnections on both the front side and the backside is selected. Among the resistors or resistor cells 600A-600D, a resistor having an odd number of resistor structures, e.g., the resistor 600A or the resistor 600B, satisfies this consideration and is selected.

For example, the resistors R71 of the circuit 700A is implemented by the resistor 700B in FIG. 7B. The resistor 700B comprises a number of resistors 701, . . . 709, 710. Each of the resistors 701, . . . 709, 710 corresponds to the resistor 600A. In an example configuration, the resistor R71 has a resistance of 50 ohm, whereas the resistor 600A has a resistance of 500 ohm. To obtain the intended resistance of 50 ohm for the resistor R71, ten instances of the resistor 600A, i.e., ten resistors 701, . . . 709, 710, are electrically coupled in parallel as shown in FIG. 7B. The resistors 701, . . . 709, 710 are electrically coupled in parallel by a front-side interconnect 711, and a backside interconnect 712. The front-side interconnect 711 comprises one or more conductive patterns in one or more front-side metal layers, and is coupled to VDD in the circuit 700A. The backside interconnect 712 comprises one or more conductive patterns in one or more backside metal layers, and is coupled to the source/drain region of the transistor Mn1 in the circuit 700A.

Figure 7C:
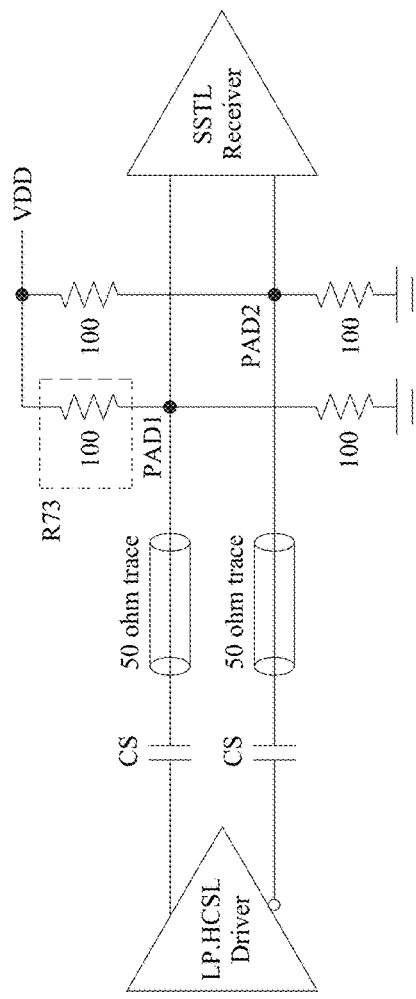
FIGS. 7C and 7D are schematic circuit diagrams of example circuits in which resistors in accordance with some embodiments are to be included.

FIG. 7C is a schematic circuit diagrams of an example circuit 700C. In an example, a resistor of the circuit 700C is configured from the resistor 600C.

The circuit 700C is a differential clock network which comprises a Low Power High Speed Current Steering Logic (LP-HCSL) driver coupled to a Stub Series Terminated Logic (SSTL) receiver via a pair of coupling capacitors and a pair of 50-ohm traces. Four load resistors of 100 ohm each are coupled between PAD1, PAD2, VDD and VSS at the ends of the 50-ohm traces. For example, a resistor R73 is coupled between VDD and PAD1. In some embodiments, VDD, VSS, PAD1 and PAD2 are all provided on the backside of an IC device. To implement the resistor R73 by one or more resistors in accordance with some embodiments, a resistor or resistor cell having both free ends for interconnections on the backside is selected. Among the resistors or resistor cells 600A-600D, the resistor 600C satisfies this consideration and is selected. The resistor 600C comprises two resistor structures each having a resistance of 1000 ohm, in an example configuration. To obtain the intended resistance of 100 ohm for the resistor R73, five instances of the resistor 600C are electrically coupled, such that ten resistor structures of the five instances of the resistor 600C are all electrically coupled in parallel resulting in an arrangement similar to FIG. 7B.

Figure 7D:
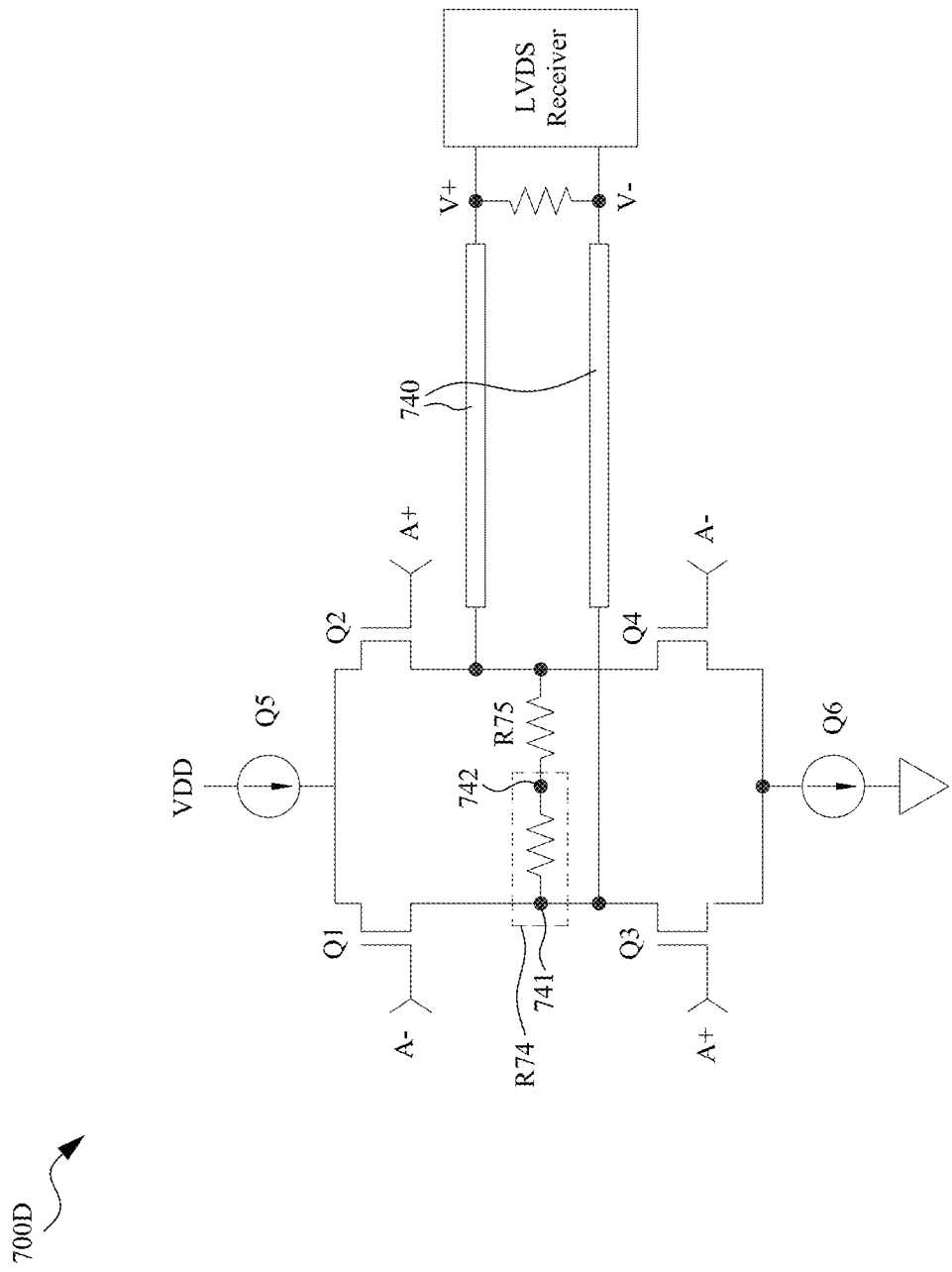

FIG. 7D is a schematic circuit diagrams of an example circuit 700D. In an example, a resistor of the circuit 700D is configured from the resistor 600D.

The circuit 700D is a low voltage differential signaling (LVDS) circuit which comprises a driver having transistors Q1-Q4 and two current sources Q5-Q6, and coupled to an LVDS receiver via a pair of transmission lines 740. A pair of resistors R74, R75 is coupled between source/drain regions of the transistors Q1-Q4. For example, resistor R74 is coupled between nodes 741, 742. The node 741 is coupled to the source/drain regions of the transistors Q1, Q3. The node 742 is coupled, via the resistor R75, to the source/drain regions of the transistors Q2, Q4. To implement the resistor R74 by one or more resistors in accordance with some embodiments, a resistor or resistor cell having both free ends for interconnections on the front side, where the source/drain regions are arranged, is selected. Among the resistors or resistor cells 600A-600D, the resistor 600D satisfies this consideration and is selected. The resistor 600D comprises two resistor structures each having a resistance of 1000 ohm, in an example configuration. To obtain the intended resistance of, e.g., 4000 ohm for the resistor R74, two instances of the resistor 600D are electrically coupled in series, such that four resistor structures of the two instances of the resistor 600D are all electrically coupled in series. In some embodiments, interconnects for coupling the multiple instances of the resistor 600D to implement the resistor R74 are all on the front side, and in one or more front side metal layers.

The circuit 700A and circuit 700C are examples of using resistors in accordance with some embodiments to obtain low resistance, whereas the circuit 700D is an example of using resistors in accordance with some embodiments to obtain high resistance. In some embodiments, high resistance is in a range of 2 k to 100 k ohm, and low resistance is below that range. Generally, circuits with a resistor of low resistance are often configured to perform a high speed operation, whereas circuits with a resistor of high resistance are often configured to perform at a lower speed. In at least one embodiment, for a circuit with a resistor of low resistance and high speed operation, whether to use a resistor cell with an even or odd number of resistor structures to implement the low resistance resistor is a consideration. A reason is that the low resistance is obtained by electrically coupling multiple resistors in parallel, for example, as described with respect to FIGS. 7A-7C. The parallel coupling of multiple resistors increases parasitic capacitance which potentially causes the circuit to operate at a speed lower than the intended speed. By selecting a resistor cell with an even or odd number of resistor structures to provide the free ends for interconnects on the correct side(s), i.e., the front side and/or the backside, as described with respect to at least FIGS. 7A-7C, it is possible to reduce the number and/or size of the interconnects for electrically coupling the resistors in parallel. As a result, it is possible to reduce parasitic capacitance and/or to perform operation at an intended high speed, in one or more embodiments. In at least one embodiment, whether to use a resistor cell with an even or odd number of resistor structures is of a lesser concern in circuits with high resistance resistors and operating at a lower speed, than in circuits with low resistance resistors and operating at a higher speed.

Figure 8A:
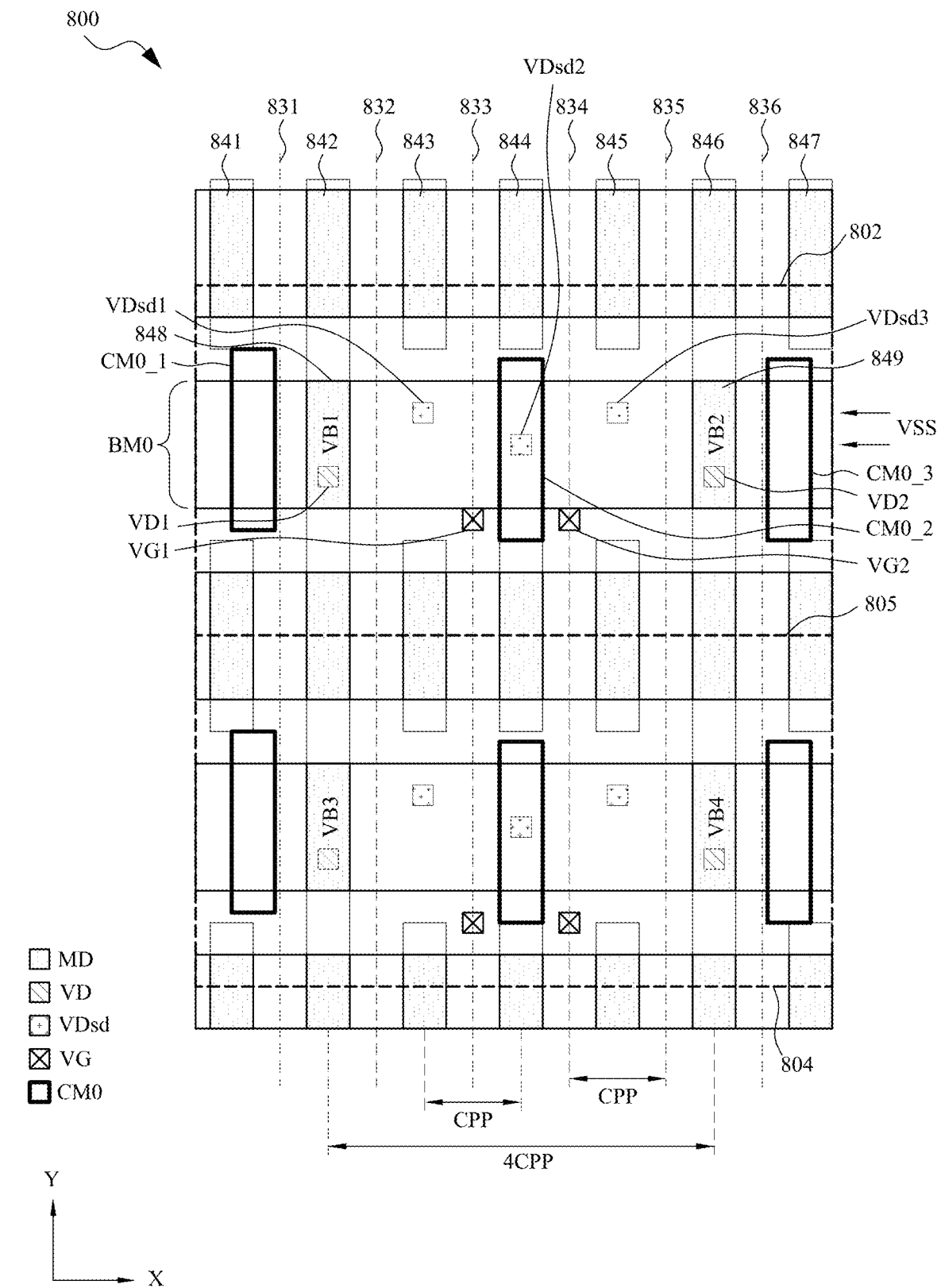
FIG. 8A is a schematic IC layout diagram of an IC device.
Figure 8B:
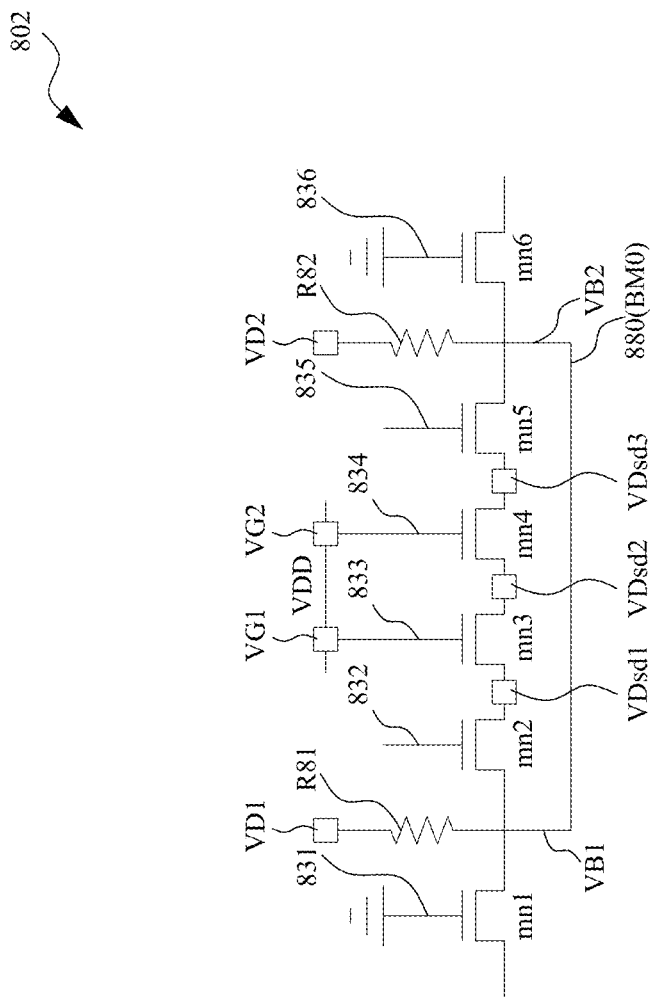
FIG. 8B is a schematic circuit diagram of a portion of the IC device, in accordance with some embodiments.

FIG. 8A is a schematic IC layout diagram of an IC device 800, and FIG. 8B is a schematic circuit diagram of a portion of the IC device 800, in accordance with some embodiments.

In FIG. 8A, the IC layout diagram of the IC device 800 comprises resistor cells 802, 804 retrieved from a cell library and placed in the IC layout diagram. The resistor cells 802, 804 are placed to abut each other along a common edge 805. A schematic circuit diagram of the resistor cell 802 is shown in FIG. 8B. A detailed description of the resistor cell 802 is given herein. In this example configuration, the resistor cells 802, 804 are identical, and a detailed description of the resistor cell 804 is omitted. Other arrangements where resistor cells with different configurations are placed side by side are within the scopes of various embodiments.

As shown in the IC layout diagram in FIG. 8A, the IC device 800 comprises a plurality of gate regions extending in the Y direction. For simplicity, the gate regions are not illustrated in FIG. 8A. Instead, gate tracks 831-836 along which the gate regions extend are shown in FIG. 8A. The reference numerals 831-836 are used herein to designate the gate regions. In at least one embodiment, one or more of the gate regions 831-836 correspond to one or more of the gate regions 132, 134, 136, 138 of the IC device 100.

The IC device 800 further comprises a plurality of active regions (not numbered) extending along the X direction. In at least one embodiment, one or more of the active regions of the IC device 800 correspond to one or more of the active regions 122, 124, 126 of the IC device 100.

The IC device 800 further comprises a plurality of MD contact structures 841-849 extending along the Y direction to make electrical contact with the underlying active regions. The MD contact structures 841-849 and the gate regions 831-836 are alternatingly arranged in the X direction. In this example configuration, a pitch between adjacent gate regions is the same as a pitch between adjacent MD contact structures, as designated at CPP (contacted poly pitch) in FIG. 8A. In at least one embodiment, one or more of the MD contact structures 841-849 correspond to one or more of the contact structures 142, 144, 146 of the IC device 100.

The IC device 800 further comprises a plurality of via structures to electrically couple various components of the IC device 800. For example, via structures VG1, VG2 are configured to electrically couple the gate regions 833, 834 to one or more corresponding conductive patterns in at least one front-side metal layer, for example, the M0 layer. In the example configuration in FIG. 8A, the via structures VG1, VG2 electrically couple the gate regions 833, 834 to a M0 conductive pattern having the positive power supply voltage VDD. In at least one embodiment, one or more of the via structures VG1, VG2 correspond to one or more of the VG via structures 152, 154, 156, 158 of the IC device 100.

Via structures VDsd1, VDsd2, VDsd3 are configured to electrically couple various source/drain regions in one or more underlying active regions to one or more corresponding conductive patterns in at least one front-side metal layer, for example, the M0 layer. In the example configuration in FIG. 8A, the via structures VDsd1, VDsd2, VDsd3 electrically couple the corresponding source/drain regions to one or more M0 conductive patterns having the ground voltage VSS, as indicated by the two arrows with the label "VSS." The IC device 800 comprises MD contact structures between the via structures VDsd1, VDsd2, VDsd3 and the corresponding source/drain regions. The MD contact structures are omitted in FIG. 8A for simplicity.

Via structures VD1, VD2 are configured to electrically couple underlying resistor structures, which are configured by one or more active regions as described herein, to one or more corresponding conductive patterns in at least one front-side metal layer, for example, the M0 layer. In at least one embodiment, one or more of the via structures VD1, VD2 correspond to the VD via structure 150 of the IC device 100.

Through via structures VB1-VB4 are schematically indicated by the common label "VB" in FIG. 8A, and are configured to electrically couple one or more overlying active regions to one or more corresponding conductive patterns in at least one backside metal layer, for example, the BM0 layer. The BM0 layer is schematically indicated by the label "BM0" in FIG. 8A. In at least one embodiment, one or more of the through via structures VB1-VB4 correspond to the VB through via structure 160 of the IC device 100.

The IC layout diagram of the IC device 800 further comprises cut-M0 (CM0) regions in which no conductive patterns in the M0 layer are arranged. For example, the resistor cell 802 comprises three CM0 regions indicated as CM0_1, CM0_2 and CM0_3.

In the schematic circuit diagram in FIG. 8B, the resistor cell 802 comprises spacer transistors mn1-mn6, and resistor structures R81, R82 electrically coupled in series by a conductive pattern 880 in the BM0 layer. The transistors mn1-mn6 have gate regions corresponding to the gate regions 831-836. In at least one embodiment, one or more of the spacer transistors mn1-mn6 correspond to one or more of the spacer transistors described with respect to FIGS. 1A-6D, one or more of the resistor structures R81, R82 correspond to one or more of the resistor structures described with respect to FIGS. 1A-6D, and the conductive pattern 880 corresponds to one or more conductive patterns or internal connections described with respect to FIGS. 6A-6D. Various via structures described with respect to FIG. 8A are also indicated in FIG. 8B.

The transistors mn2-mn5 are arranged between the resistor structures R81, R82. The transistors mn2 and mn5 immediately adjacent to the resistor structures R81, R82 are configured to have floating gate regions 832, 835. A purpose, as described herein in some amendments, is to reduce parasitic capacitance for a high speed operation.

The transistors mn3, mn4 not immediately adjacent to the resistor structures R81, R82 are electrically coupled to be decoupling capacitors. In the example configuration in FIG. 8B where the spacer transistors are NMOS transistors, the transistors mn3, mn4 are electrically coupled to be decoupling capacitors by electrically coupling the corresponding gate regions 833, 834 to VDD through the via structures VG1, VG2, and electrically coupling the corresponding source/drain regions of the transistors mn3, mn4 to VSS through the via structures VDsd1, VDsd2, VDsd3. In some embodiments where the spacer transistors are PMOS transistors, the transistors mn3, mn4 are electrically coupled to be decoupling capacitors by electrically coupling the corresponding gate regions 833, 834 to VSS and the corresponding source/drain regions to VDD. As a result, in at least one embodiment, the transistors mn3, mn4 electrically coupled to be decoupling capacitors provide decoupling capacitances useful in one or more applications or operation modes of the IC device 800 which, in turn, makes it possible to reduce a chip or wafer area designated for specifically configured decoupling capacitors. In at least one embodiment where additional decoupling capacitances are not required, the gate regions 833, 834 of the transistors mn3, mn4 are grounded or left floating.

The transistors mn1, mn6 are not arranged between the resistor structures R81, R82, and are immediately adjacent the resistor structures R81, R82, are electrically coupled to be in an always-OFF state, by electrically coupling the corresponding gate regions 831, 836 to VSS. In at least one embodiment, the gate regions 831, 836 of the transistors mn1, mn6 are left floating.

The number of four spacer transistors between the adjacent resistor structures R81, R82 in FIGS. 8A, 8B is an example. As indicated in FIG. 8A, this example configuration results in a center-to-center distance of 4CPP between the through via structures VB1, VB2 or between the via structures VD1, VD2 which electrically couple the resistor structures R81, R82 to other circuit elements. In some embodiments, a distance of 4CPP or above between adjacent via structures for coupling resistor structures relaxes one or more requirements, and/or reduces complexity or cost of the manufacturing process. The chip or wafer area occupied by the spacer transistors is used in at least one embodiment for decoupling capacitance without affecting the operation speed. However, a smaller distance between adjacent via structures for coupling resistor structures is still within the scopes of various embodiments, for example, as described with respect to FIGS. 9A-9B.

Figure 9A:
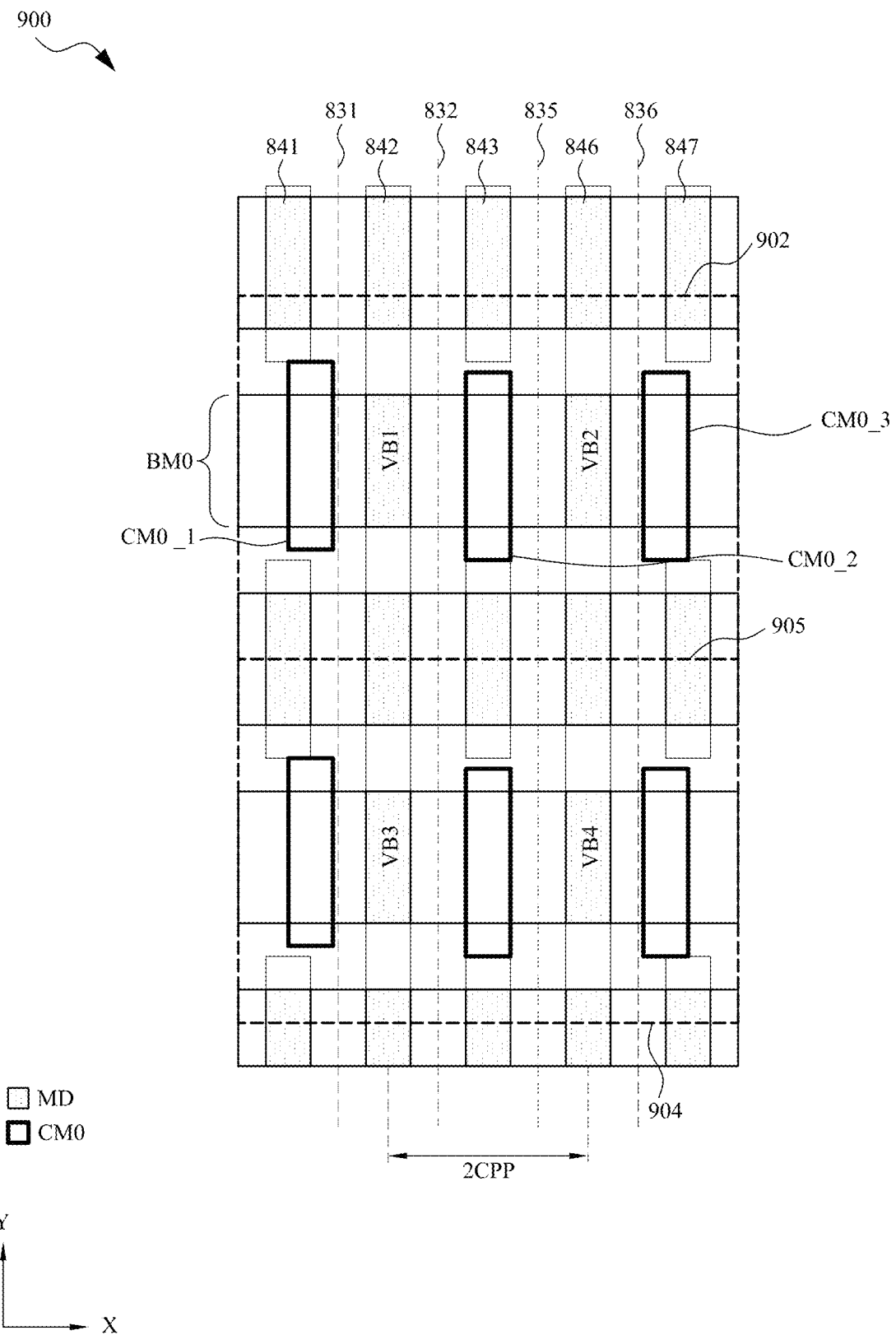
FIG. 9A is a schematic IC layout diagram of an IC device.
Figure 9B:
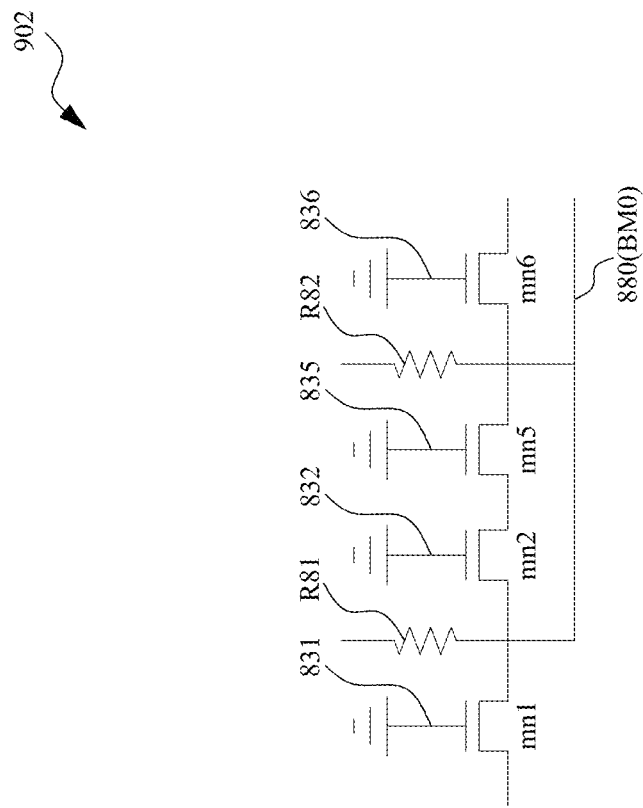
FIG. 9B is a schematic circuit diagram of a portion of the IC device, in accordance with some embodiments.

FIG. 9A is a schematic IC layout diagram of an IC device 900, and FIG. 9B is a schematic circuit diagram of a portion of the IC device 900, in accordance with some embodiments.

In FIG. 9A, the IC layout diagram of the IC device 900 comprises resistor cells 902, 904 retrieved from a cell library and placed in the IC layout diagram. The resistor cells 902, 904 are placed to abut each other along a common edge 905. A schematic circuit diagram of the resistor cell 902 is shown in FIG. 9B. In this example configuration, the resistor cells 902, 904 are identical. Other arrangements where resistor cells with different configurations are placed side by side are within the scopes of various embodiments.

Compared to the resistor cell 802 with four spacer transistors between the resistor structures R81, R82, the resistor cell 902 in FIG. 9B comprises two spacer transistors mn2, mn5 between the resistor structures R81, R82. As indicated in FIG. 9A, this configuration results in a center-to-center distance of 2CPP between the through via structures VB1, VB2 which electrically couple the resistor structures R81, R82 to other circuit elements. In some situations, the reduced distance between adjacent via structures for coupling resistor structures complicates the manufacturing process, but is advantageous in that the size of resistors on a chip or wafer is reduced. In the example configuration in FIG. 9B, the transistors mn1, mn2, mn5, mn6 are electrically coupled to be in an always-OFF state. Other configurations are within the scopes of various embodiments. For example, at least one embodiment, one or more of the transistors mn1, mn2, mn5, mn6 are configured to have floating gate regions.

Figure 10:
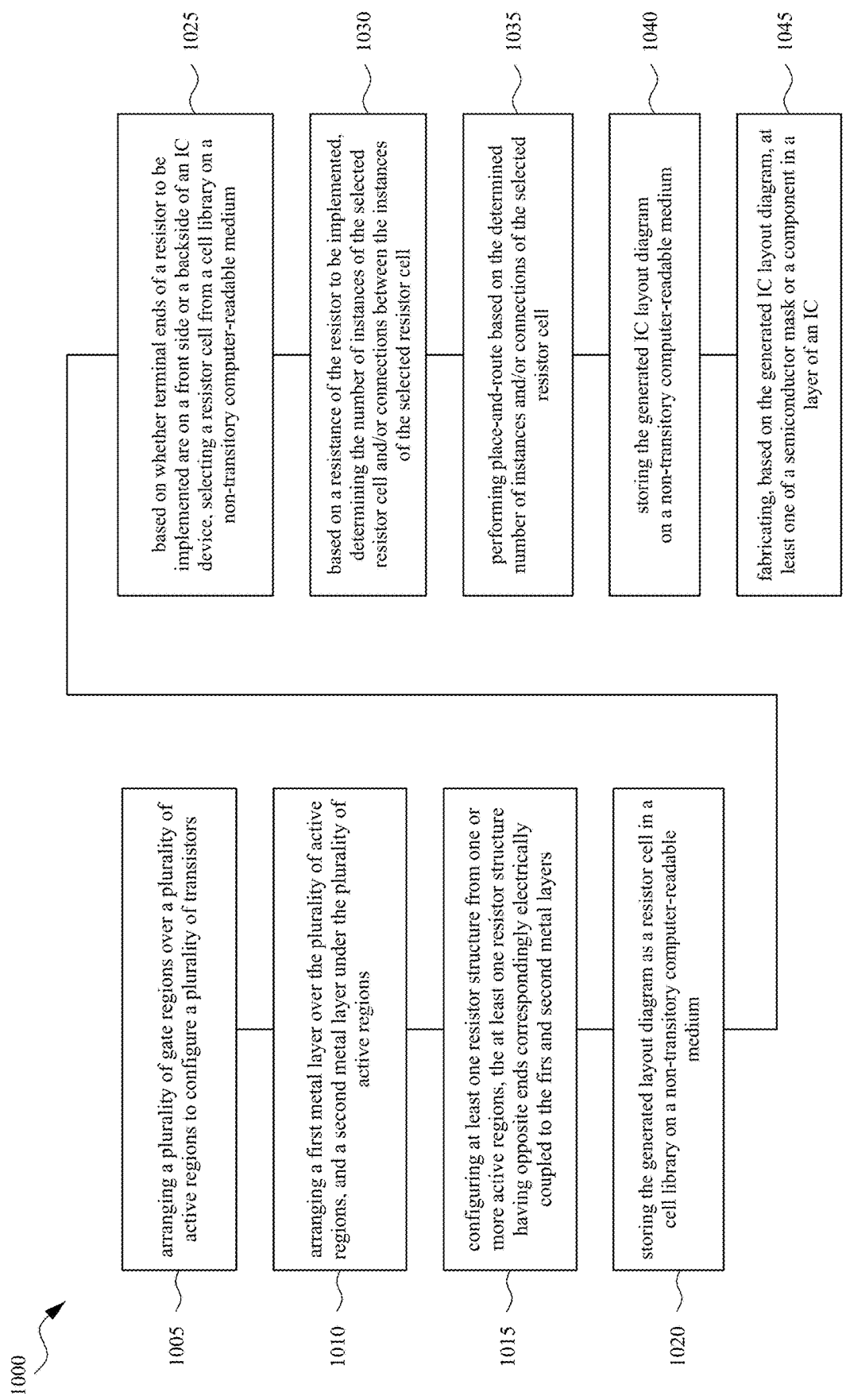
FIG. 10 is a flow chart of a method, in accordance with some embodiments.

FIG. 10 is a flow chart of a method 1000, in accordance with some embodiments. In at least one embodiment, the method 1000 is for one or more of generating a layout diagram for a resistor cell, building a standard cell library including one or more resistor cells, or generating a layout diagram of an IC using one or more resistor cells from a standard cell library.

In some embodiments, one or more operations of the method 1000 are performed as part of a method of forming one or more IC devices described herein. In some embodiments, one or more operations of the method 1000 are performed as part of an automated placement and routing (APR) method. In some embodiments, one or more operations of the method 1000 are performed by an APR system, e.g., a system included in an EDA system described with respect to FIG. 12. In some embodiments, one or more operations of the method 1000 are performed as part of a design procedure performed in a design house described with respect to FIG. 13. In some embodiments, one or more operations of the method 1000 are executed by a processor, such as a processor of an EDA system described with respect to FIG. 12. In some embodiments, one or more operations in the method 1000 described herein are omitted.

In some embodiments, a process for generating a layout diagram for a resistor cell and/or building a standard cell library including one or more resistor cells comprises one or more of operations 1005, 1010, 1015, 1020.

At operation 1005, a plurality of gate regions is arranged over a plurality of active regions to configure a plurality of transistors. For example, gate regions 134, 136 are arranged over active regions 122, 124, 126 to configure transistors M1, M2, as described with respect to FIGS. 1A, 1B. Further examples are described with respect to FIGS. 2A-2B, 3A-3B, 4A-4B, 5A-5B.

At operation 1010, a first metal layer is arranged over the plurality of active regions, and a second metal layer is arranged under the plurality of active regions. For example, a M0 layer 170 is arranged over the active regions 122, 124, 126, and a BM0 layer 180 is arranged under the active regions 122, 124, 126, as described with respect to FIGS. 1A, 1B. Further examples are described with respect to FIGS. 2A-2B, 3A-3B, 4A-4B, 5A-5B.

At operation 1015, at least one resistor structure is configured from one or more active regions, and has opposite ends to be correspondingly electrically coupled to the first metal layer and the second metal layer. For example, as described with respect to FIGS. 1A-1B, a resistor structure R is configured from the active region 124. Opposite ends 125, 127 of the resistor structure R are defined by opposite surfaces 128, 129 of the active region 124, and are configured to be electrically coupled to the M0 layer 170 and the BM0 layer 180. On the front side, an electrical connection from an M0 conductive pattern 171 in the M0 layer 170 to the resistor structure R comprises an MD contact structure 144 and a VD via structure 150. On the backside, an electrical connection from a BM0 conductive pattern 182 in the BM0 layer 180 to the resistor structure R comprises a VB through via structure 160. More than one resistor structures are configured and/or one or more internal connections are determined, for example, as described with respect to FIGS. 2A-2B, 3A-3B, 4A-4B, 5A-5B, 6B-6D.

At operation 1020, the generated layout diagram with one or more resistor structures is stored as a resistor cell in a standard cell library on a non-transitory computer-readable medium. In some embodiments, various resistor cells are generated, as described with respect to FIGS. 6A-6D, and stored in the standard cell library.

In some embodiments, a process for generating a layout diagram of an IC device using one or more resistor cells from a standard cell library comprises one or more of operations 1025, 1030, 1035, 1040.

At operation 1025, based on whether terminal ends of a resistor to be implemented in the IC device are on a front side or a backside of the IC device, a resistor cell is selected from a cell library on a non-transitory computer-readable medium. For example, as described with respect to FIGS. 7A-7B, because a resistor R71 to be implemented has one terminal electrically coupled to VDD on the backside of an IC device and another terminal electrically coupled to a source/drain region on the front side, a resistor cell, e.g., 600A, having an odd number of resistor structures is selected from a library. Further examples are described with respect to FIGS. 7C-7D.

At operation 1030, based on a resistance of the resistor to be implemented, the number of instances of the selected resistor cell and/or connections between the instances of the selected resistor cell are determined. For example, as described with respect to FIGS. 7A-7B, because the resistor R71 to be implemented has a resistance of 50 ohm whereas each resistor structure in the selected resistor cell 600A has resistance of 500 ohm, it is determined to electrically couple ten instances of the resistor cell 600A in parallel to obtain the intended resistance of 50 ohm. Further examples are described with respect to FIGS. 7C-7D.

At operation 1035, a place and route operation is perform based on the determined number of instances and/or connections of the selected resistor cell, for example, as described with respect to FIG. 7B. Further examples are described with respect to FIGS. 7C-7D.

At operation 1040, the generated IC layout diagram is stored on a non-transitory computer-readable medium.

Figure 13:
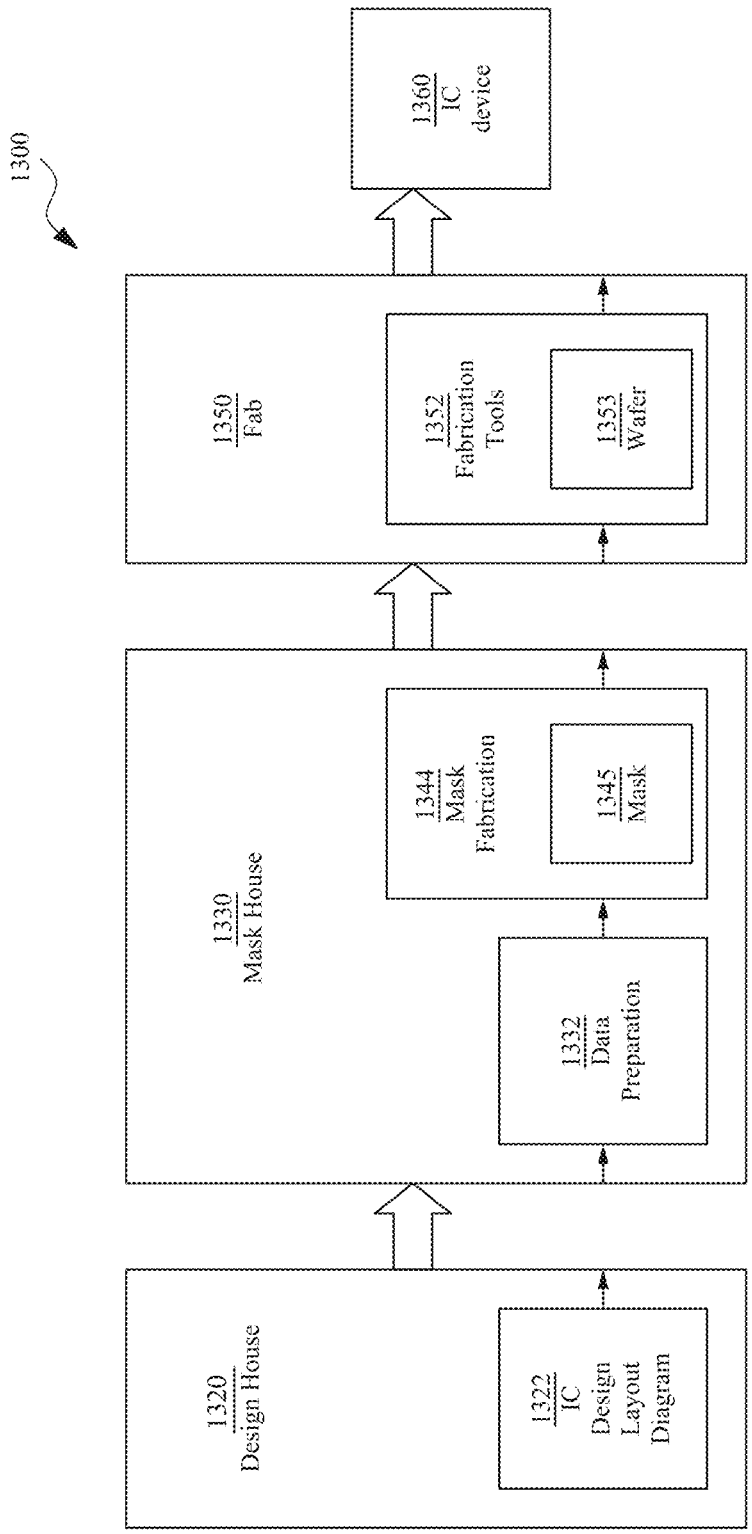
FIG. 13 is a block diagram of an IC manufacturing system and an IC manufacturing flow associated therewith, in accordance with some embodiments.

At operation 1045, based on the generated IC layout diagram, at least one of a semiconductor mask or a component in a layer of an IC is fabricated, for example, as described with respect to FIG. 13. In at least one embodiment, operation 1045 is omitted.

In at least one embodiment, all operations of the method 1000 are automatically performed without user input or intervention.

In some embodiments, one or more cells, IC devices, and methods described are applicable to various types of transistor or device technologies including, but not limited to, planar transistor technology, FINFET technology, nanosheet FET technology, nanowire FET technology, or the like.

Figure 11:
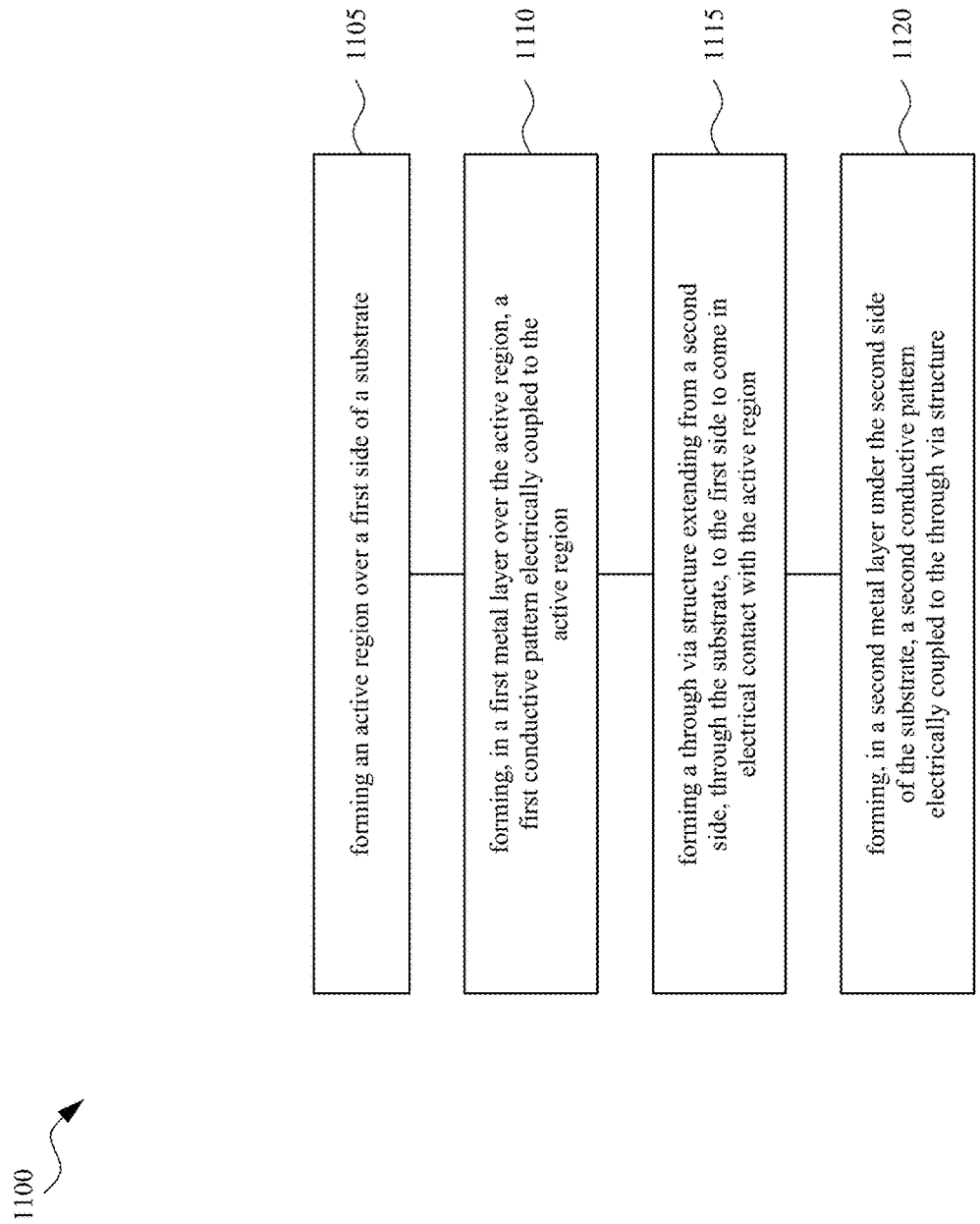
FIG. 11 is a flow chart of a method, in accordance with some embodiments.

FIG. 11 is a flow chart of a method 1100 of manufacturing an IC device, in accordance with some embodiments. In at least one embodiment, an IC device is manufactured in accordance with the manufacturing method 1100 based on an IC layout diagram generated by the method 1000.

At operation 1105, an active region is formed over a first side of a substrate. For example, as described with respect to FIG. 1A, an active region 124 is formed over a first side 111 of a substrate 110. The active region 124 is configured as a resistor structure R, as described herein.

In some embodiments, the substrate is a semiconductor material (e.g., silicon, doped silicon, GaAs, or another semiconductor material). In some embodiments, the substrate is a P-doped substrate. In some embodiments, the substrate is an N-doped substrate. In some embodiments, the substrate is a rigid crystalline material other than a semiconductor material (e.g., diamond, sapphire, aluminum oxide ($Al_2O_3$), or the like) on which an IC is manufactured. In some embodiments, N-type and P-type dopants are added to the substrate to form N wells and P wells, respectively. In some embodiments, dopants are added to the substrate by, e.g., an ion implant tool. In some embodiments, isolation structures are formed between adjacent P wells and N wells by etching trenches in the substrate with a dry or plasma etch process, and then filling the trenches with a dielectric material, e.g., silicon oxide, or spin on glass. Active regions, including the active region 124 configured as resistor structure R, are formed over the P wells and N wells, e.g., by ion implantation.

In some embodiments, gate regions are formed over the active regions, to form circuit elements or transistors. In some embodiments, a gate oxide is deposited over an active region, and then a conductive gate electrode is deposited over the gate oxide to form a gate region. Example materials of the gate oxide include $HfO_2$, $ZrO_2$, or the like. Example materials of the gate electrode include polysilicon, metal, or the like.

In some embodiments, contacts to the active regions and gate regions are formed. For example, an interlayer dielectric (ILD) layer is deposited over the substrate after forming the gate regions. The ILD layer is then etched in portions corresponding to the active regions and gate regions, the etched portions are filled with a conductive material, such as metal, to form one or more MD contact structures and/or via structures, including a contact structure 144 and a via structure 150 which provide electrical connection to the active region 124 configured as resistor structure R.

At operation 1110, in a first metal layer over the active region, a first conductive pattern is formed to be electrically coupled to the active region configured as a resistor structure. For example, as described with respect to FIGS. 1A, 1B, a conductive pattern 171 in a M0 layer 170 over the active region 124 is formed to be electrically coupled to the active region 124.

In some embodiments, a front side metallization process is performed. For example, the M0 layer is deposited over MD contact structures and/or via structures, and patterned to define various interconnects to the various circuit elements or transistors formed in the previous operations. The conductive pattern 171 is formed in the M0 layer, together with the other interconnects, to be coupled to the active region 124 configured as resistor structure R through the previously formed contact structure 144 and via structure 150. In at least one embodiment, the described front side metallization process is repeated multiple times to form various front side metal layers connected by multiple front side via layers to define various connections within the IC being manufactured and/or external connections with other equipment outside the IC device. In at least one embodiment, the conductive pattern 171 is formed in a front side metal layer other than the M0 layer.

At operation 1115, a through via structure is formed to extend from a second side, through the substrate, to the first side in electrical contact with the active region configured as a resistor structure. For example, as described with respect to FIG. 1A, a through via structure 160 is formed to extend from a second side 112, through the substrate 110, to the first side 111 in electrical contact with the active region 124 configured as resistor structure R.

In some embodiments, after the described metallization process on the front side, the substrate is flipped upside down and bonded to a carrier via an adhesive to expose the backside of the substrate. A thickness portion on the backside of the substrate is removed, for example, by an etch or mechanical grinding process. Backside via structures are formed to extend through the ground substrate at various locations to form, for example, power connections to power rails to be formed later. The through via structure 160 is formed in this operation together with other backside via structures.

At operation 1120, in a second metal layer under the second side of the substrate, a second conductive pattern is formed to be electrically coupled to the through via structure. For example, as described with respect to FIGS. 1A-1B, in the BM0 layer 180 under the second side 112 of the substrate 110, a conductive pattern 182 is formed to be electrically coupled to the through via structure 160.

In some embodiments, following the formation of the backside via structures, a backside metallization process is performed. For example, the BM0 layer is deposited over the through via structure 160 and other backside via structures, and patterned to define various backside interconnects to the backside via structures. Example backside interconnects include power rails of one or more power supply voltages. The conductive pattern 182 is formed in the BM0 layer, together with the other backside interconnects, to be coupled to the through via structure 160. In at least one embodiment, the described backside metallization process is repeated multiple times to form various backside metal layers connected by multiple backside via layers to define, for example, connections of the IC device to external circuitry or power source. In at least one embodiment, the BM0 conductive pattern 182 is formed in a backside metal layer other than the BM0 layer. Upon completion of the backside metallization process, the carrier is removed from the substrate, with subsequent processing, e.g., singulation and/or packaging, to follow.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 12:
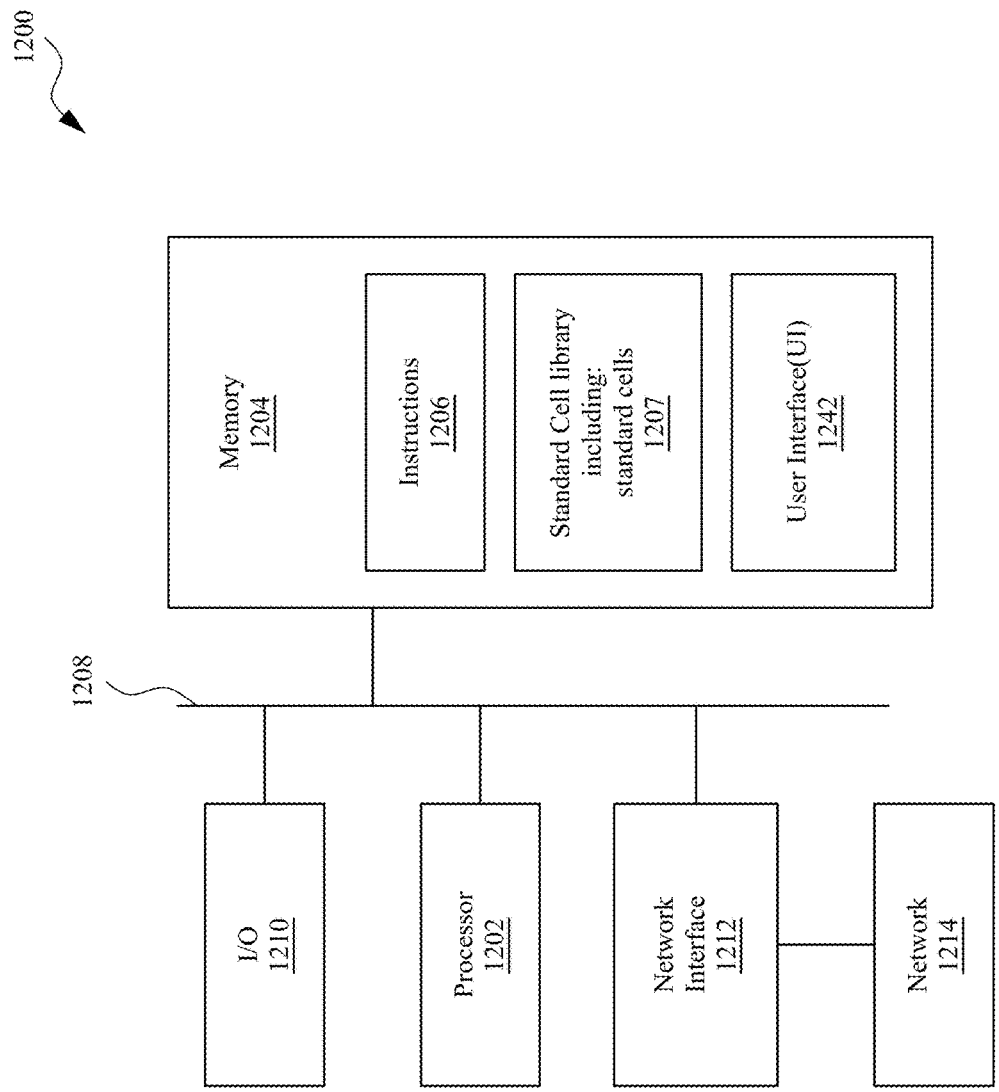
FIG. 12 is a block diagram of an EDA system, in accordance with some embodiments.

FIG. 12 is a block diagram of an electronic design automation (EDA) system 1200 in accordance with some embodiments.

In some embodiments, EDA system 1200 includes an APR system. Methods described herein of designing layout diagrams represent wire routing arrangements, in accordance with one or more embodiments, are implementable, for example, using EDA system 1200, in accordance with some embodiments.

In some embodiments, EDA system 1200 is a general purpose computing device including a hardware processor 1202 and a non-transitory, computer-readable storage medium 1204. Storage medium 1204, amongst other things, is encoded with, i.e., stores, computer program code 1206, i.e., a set of executable instructions. Execution of instructions 1206 by hardware processor 1202 represents (at least in part) an EDA tool which implements a portion or all of the methods described herein in accordance with one or more embodiments (hereinafter, the noted processes and/or methods).

Processor 1202 is electrically coupled to computer-readable storage medium 1204 via a bus 1208. Processor 1202 is also electrically coupled to an I/O interface 1210 by bus 1208. A network interface 1212 is also electrically connected to processor 1202 via bus 1208. Network interface 1212 is connected to a network 1214, so that processor 1202 and computer-readable storage medium 1204 are capable of connecting to external elements via network 1214. Processor 1202 is configured to execute computer program code 1206 encoded in computer-readable storage medium 1204 in order to cause system 1200 to be usable for performing a portion or all of the noted processes and/or methods. In one or more embodiments, processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause system 1200 (where such execution represents (at least in part) the EDA tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores library 1207 of standard cells including such standard cells as disclosed herein.

EDA system 1200 includes I/O interface 1210. I/O interface 1210 is coupled to external circuitry. In one or more embodiments, I/O interface 1210 includes a keyboard, keypad, mouse, trackball, trackpad, touchscreen, and/or cursor direction keys for communicating information and commands to processor 1202.

EDA system 1200 also includes network interface 1212 coupled to processor 1202. Network interface 1212 allows system 1200 to communicate with network 1214, to which one or more other computer systems are connected. Network interface 1212 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1200.

System 1200 is configured to receive information through I/O interface 1210. The information received through I/O interface 1210 includes one or more of instructions, data, design rules, libraries of standard cells, and/or other parameters for processing by processor 1202. The information is transferred to processor 1202 via bus 1208. EDA system 1200 is configured to receive information related to a UI through I/O interface 1210. The information is stored in computer-readable medium 1204 as user interface (UI) 1242.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1200. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

FIG. 13 is a block diagram of an integrated circuit (IC) manufacturing system 1300, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1300.

In FIG. 13, IC manufacturing system 1300 includes entities, such as a design house 1320, a mask house 1330, and an IC manufacturer/fabricator ("fab") 1350, that interact with one another in the design, development, and manufacturing cycles and/or services related to manufacturing an IC device 1360. The entities in system 1300 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1320, mask house 1330, and IC fab 1350 is owned by a single larger company. In some embodiments, two or more of design house 1320, mask house 1330, and IC fab 1350 coexist in a common facility and use common resources.

Design house (or design team) 1320 generates an IC design layout diagram 1322. IC design layout diagram 1322 includes various geometrical patterns designed for an IC device 1360. The geometrical patterns correspond to patterns of metal, oxide, or semiconductor layers that make up the various components of IC device 1360 to be fabricated. The various layers combine to form various IC features. For example, a portion of IC design layout diagram 1322 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1320 implements a proper design procedure to form IC design layout diagram 1322. The design procedure includes one or more of logic design, physical design or place-and-route operation. IC design layout diagram 1322 is presented in one or more data files having information of the geometrical patterns. For example, IC design layout diagram 1322 can be expressed in a GDSII file format or DFII file format.

Mask house 1330 includes data preparation 1332 and mask fabrication 1344. Mask house 1330 uses IC design layout diagram 1322 to manufacture one or more masks 1345 to be used for fabricating the various layers of IC device 1360 according to IC design layout diagram 1322. Mask house 1330 performs mask data preparation 1332, where IC design layout diagram 1322 is translated into a representative data file ("RDF"). Mask data preparation 1332 provides the RDF to mask fabrication 1344. Mask fabrication 1344 includes a mask writer. A mask writer converts the RDF to an image on a substrate, such as a mask (reticle) 1345 or a semiconductor wafer 1353. The design layout diagram 1322 is manipulated by mask data preparation 1332 to comply with particular characteristics of the mask writer and/or requirements of IC fab 1350. In FIG. 13, mask data preparation 1332 and mask fabrication 1344 are illustrated as separate elements. In some embodiments, mask data preparation 1332 and mask fabrication 1344 can be collectively referred to as mask data preparation.

In some embodiments, mask data preparation 1332 includes optical proximity correction (OPC) which uses lithography enhancement techniques to compensate for image errors, such as those that can arise from diffraction, interference, other process effects and the like. OPC adjusts IC design layout diagram 1322. In some embodiments, mask data preparation 1332 includes further resolution enhancement techniques (RET), such as off-axis illumination, subresolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1332 includes a mask rule checker (MRC) that checks the IC design layout diagram 1322 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1322 to compensate for limitations during mask fabrication 1344, which may undo part of the modifications performed by OPC in order to meet mask creation rules.

In some embodiments, mask data preparation 1332 includes lithography process checking (LPC) that simulates processing that will be implemented by IC fab 1350 to fabricate IC device 1360. LPC simulates this processing based on IC design layout diagram 1322 to create a simulated manufactured device, such as IC device 1360. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1322.

It should be understood that the above description of mask data preparation 1332 has been simplified for the purposes of clarity. In some embodiments, data preparation 1332 includes additional features such as a logic operation (LOP) to modify the IC design layout diagram 1322 according to manufacturing rules. Additionally, the processes applied to IC design layout diagram 1322 during data preparation 1332 may be executed in a variety of different orders.

After mask data preparation 1332 and during mask fabrication 1344, a mask 1345 or a group of masks 1345 are fabricated based on the modified IC design layout diagram 1322. In some embodiments, mask fabrication 1344 includes performing one or more lithographic exposures based on IC design layout diagram 1322. In some embodiments, an electron-beam (e-beam) or a mechanism of multiple e-beams is used to form a pattern on a mask (photomask or reticle) 1345 based on the modified IC design layout diagram 1322. Mask 1345 can be formed in various technologies. In some embodiments, mask 1345 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1345 includes a transparent substrate (e.g., fused quartz) and an opaque material (e.g., chromium) coated in the opaque regions of the binary mask. In another example, mask 1345 is formed using a phase shift technology. In a phase shift mask (PSM) version of mask 1345, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1344 is used in a variety of processes. For example, such a mask(s) is used in an ion implantation process to form various doped regions in semiconductor wafer 1353, in an etching process to form various etching regions in semiconductor wafer 1353, and/or in other suitable processes.

IC fab 1350 is an IC fabrication business that includes one or more manufacturing facilities for the fabrication of a variety of different IC products. In some embodiments, IC Fab 1350 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1350 includes fabrication tools 1352 configured to execute various manufacturing operations on semiconductor wafer 1353 such that IC device 1360 is fabricated in accordance with the mask(s), e.g., mask 1345. In various embodiments, fabrication tools 1352 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1350 uses mask(s) 1345 fabricated by mask house 1330 to fabricate IC device 1360. Thus, IC fab 1350 at least indirectly uses IC design layout diagram 1322 to fabricate IC device 1360. In some embodiments, semiconductor wafer 1353 is fabricated by IC fab 1350 using mask(s) 1345 to form IC device 1360. In some embodiments, the IC fabrication includes performing one or more lithographic exposures based at least indirectly on IC design layout diagram 1322. Semiconductor wafer 1353 includes a silicon substrate or other proper substrate having material layers formed thereon. Semiconductor wafer 1353 further includes one or more of various doped regions, dielectric features, multi-level interconnects, and the like (formed at subsequent manufacturing steps).

Details regarding an integrated circuit (IC) manufacturing system (e.g., system 1300 of FIG. 13), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises a substrate, a first active region, first and second conductive patterns, and a first through via structure. The substrate has opposite first and second sides. The first active region is over the first side of the substrate. The first conductive pattern is over and electrically coupled to the first active region. The first through via structure extends from the second side, through the substrate, to the first side in electrical contact with the first active region. The second conductive pattern is under the second side of the substrate and electrically coupled to the first through via structure.

In some embodiments, an integrated circuit (IC) device comprises a plurality of active regions, a plurality of gate regions over the plurality of active regions, a first metal layer over the plurality of active regions, a second metal layer under the plurality of active regions, and at least one resistor structure. The plurality of gate regions and the plurality of active regions together are configures as a plurality of transistors. Each of the at least one resistor structure comprises an active region among the plurality of active regions, and has opposite ends correspondingly electrically coupled to the first metal layer and the second metal layer.

In some embodiments, a method comprises forming an active region over a first side of a substrate. The substrate has a second side opposite the first side. In a first metal layer over the active region, a first conductive pattern is formed to be electrically coupled to the active region. A through via structure is formed to extend from the second side, through the substrate, to the first side in electrical contact with the active region. In a second metal layer under the second side of the substrate, a second conductive pattern is formed to be electrically coupled to the through via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
a substrate having opposite first and second sides;
a first active region over the first side of the substrate;
a first conductive pattern over and electrically coupled to the first active region;
a first through via structure extending from the second side, through the substrate, to the first side in electrical contact with the first active region;
a second conductive pattern under the second side of the substrate and electrically coupled to the first through via structure;
a contact structure over and in electrical contact with the first active region; and
a via structure extending between and electrically coupling the first conductive pattern to the contact structure,
wherein, in a plan view along a thickness direction of the substrate from the first side to the second side,
the first conductive pattern, the via structure, the contact structure, the first active region, the first through via structure and the second conductive pattern overlap one another.

2. The IC device of claim 1, wherein
the first active region is configured as a resistor structure.

3. The IC device of claim 1, wherein
the second conductive pattern comprises a power supply voltage rail.

4. The IC device of claim 1, wherein
the first conductive pattern is in a metal-zero layer, and
the second conductive pattern is in a backside metal-zero layer.

5. The IC device of claim 1,
wherein the contact structure and the first through via structure are in direct contact with corresponding opposite surfaces of the first active region.

6. The IC device of claim 1, further comprising:
a plurality of active regions over the first side of the substrate, the plurality of active regions comprising the first active region; and
a plurality of gate regions over the plurality of active regions,
wherein
the plurality of gate regions and the plurality of active regions together are configured as a plurality of transistors,
the plurality of transistors comprises a pair of first adjacent transistors on opposite sides of the first active region, and
the pair of first adjacent transistors
are electrically coupled to be in an always-OFF state, or
have the corresponding gate regions floating.

7. The IC device of claim 6, further comprising:
a second through via structure extending from the second side, through the substrate, to the first side in electrical contact with a second active region among the plurality of active regions,
wherein
the first and second active regions are electrically coupled one to another through at least one of the first conductive pattern or the second conductive pattern,
the plurality of transistors further comprises a pair of second adjacent transistors on opposite sides of the second active region, and
the pair of first adjacent transistors and the pair of second adjacent transistors
are electrically coupled to be in the always-OFF state, or
have the corresponding gate regions floating.

8. The IC device of claim 7, wherein
the plurality of transistors further comprises at least one third transistor between the pair of first adjacent transistors and the pair of second adjacent transistors, and
the pair of first adjacent transistors, the pair of second adjacent transistors and the at least one third transistor
are electrically coupled to be in the always-OFF state, or
have the corresponding gate regions floating.

9. The IC device of claim 1, further comprising:
a plurality of active regions over the first side of the substrate, the plurality of active regions comprising the first active region and a second active region;
a plurality of gate regions over the plurality of active regions; and
a second through via structure extending from the second side, through the substrate, to the first side in electrical contact with the second active region,
wherein
the first and second active regions are electrically coupled one to another through at least one of the first conductive pattern or the second conductive pattern,
the plurality of gate regions and the plurality of active regions together are configured as a plurality of transistors,
the plurality of transistors comprises
a pair of adjacent first and second transistors on opposite sides of the first active region, the second transistor between the first active region and the second active region,
a pair of adjacent third and fourth transistors on opposite sides of the second active region, the third transistor between the first active region and the second active region, and at least one fifth transistor between the second transistor and the third transistors, the first transistor and the fourth transistor are electrically coupled to be in an always-OFF state, the second transistor and the third transistor have the corresponding gate regions floating, and the at least one fifth transistor is electrically coupled into a capacitor.

10. The IC device of claim 1, further comprising:

a second active region over the first side of the substrate;

a second through via structure extending from the second side, through the substrate, to the first side in electrical contact with the second active region, wherein the first and second active regions are electrically coupled one to another through at least one of the first conductive pattern or the second conductive pattern.

11. An integrated circuit (IC) device, comprising:

a plurality of active regions;

a plurality of gate regions over the plurality of active regions, the plurality of gate regions and the plurality of active regions together configured as a plurality of transistors;

a first metal layer over the plurality of active regions;

a second metal layer under the plurality of active regions; and at least one resistor structure, wherein the at least one resistor structure comprises an active region among the plurality of active regions, and has opposite ends correspondingly electrically coupled to the first metal layer and the second metal layer.

12. The IC device of claim 11, wherein the plurality of transistors comprises a pair of adjacent transistors on opposite sides of the active region of the at least one resistor structure, the pair of adjacent transistors have source/drain regions in the active region of the at least one resistor structure, and the pair of adjacent transistors
are electrically coupled to be in an always-OFF state, or
have the corresponding gate regions floating.

13. The IC device of claim 11, wherein the at least one resistor structure comprises a plurality of resistor structures, adjacent resistor structures among the plurality of resistor structures are spaced by at least two transistors among the plurality of transistors, and the at least two transistors
are electrically coupled to be in an always-OFF state, or
have the corresponding gate regions floating.

14. The IC device of claim 11, wherein the at least one resistor structure comprises a number of resistor structures electrically coupled in parallel by a first conductive pattern in the first metal layer and a second conductive pattern in the second metal layer to configure a resistor.

15. The IC device of claim 14, wherein the second conductive pattern in the second metal layer comprises a power supply voltage rail.

16. The IC device of claim 11, wherein the at least one resistor structure comprises a plurality of resistor structures configured as a plurality of resistors electrically coupled one to another, and an odd number of resistor structures among the plurality of resistor structures is electrically coupled in series by at least one first conductive pattern in the first metal layer and at least one second conductive pattern in the second metal layer to configure each resistor among the plurality of resistors.

17. The IC device of claim 11, wherein the at least one resistor structure comprises a plurality of resistor structures configured as a plurality of resistors electrically coupled one to another, and an even number of resistor structures among the plurality of resistor structures is electrically coupled one to another by a first conductive pattern in the first metal layer or by a second conductive pattern in the second metal layer to configure each resistor among the plurality of resistors.

18. A method, comprising:

forming an active region over a first side of a substrate, the substrate having a second side opposite the first side;

forming, in a first metal layer over the active region, a first conductive pattern electrically coupled to the active region;

forming a through via structure extending from the second side, through the substrate, to the first side in electrical contact with the active region;

forming, in a second metal layer under the second side of the substrate, a second conductive pattern electrically coupled to the through via structure;

forming a contact structure over and in electrical contact with the active region; and forming a via structure over the contact structure and electrically coupling the first conductive pattern to the contact structure, wherein the contact structure and the through via structure are in direct contact with corresponding opposite sides of the active region.

19. The method of claim 18, wherein the first metal layer is a metal-zero layer, and the second metal layer is a backside metal-zero layer.

20. The method of claim 18, further comprising:

forming a further active region over the first side of the substrate; and forming a further through via structure extending from the second side, through the substrate, to the first side in electrical contact with the further active region, wherein the active region and the further active region are electrically coupled one to another through at least one of the first conductive pattern or the second conductive pattern.

* * * * *